US011934219B2

(12) United States Patent
Jain et al.

(10) Patent No.: US 11,934,219 B2
(45) Date of Patent: Mar. 19, 2024

(54) INTEGRATED FUNCTIONAL AND DESIGN FOR TESTABILITY (DFT) CLOCK DELIVERY ARCHITECTURE

(71) Applicant: QUALCOMM Incorporated, San Diego, CA (US)

(72) Inventors: Arvind Jain, San Diego, CA (US); Divya Gangadharan, San Diego, CA (US); Muhammad Nasir, San Diego, CA (US); Hong Dai, San Diego, CA (US); Madan Krishnappa, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 136 days.

(21) Appl. No.: 17/707,621

(22) Filed: Mar. 29, 2022

(65) Prior Publication Data
US 2023/0315141 A1    Oct. 5, 2023

(51) Int. Cl.
*G06F 1/06* (2006.01)
*G01R 31/317* (2006.01)
*H04B 1/401* (2015.01)

(52) U.S. Cl.
CPC ......... *G06F 1/06* (2013.01); *G01R 31/31727* (2013.01); *H04B 1/401* (2013.01)

(58) Field of Classification Search
CPC .......................................................... G06F 1/06
USPC ........................................................ 327/291
See application file for complete search history.

(56) References Cited

U.S. PATENT DOCUMENTS

| 2008/0010572 | A1 | 1/2008 | Sul |
| 2012/0166860 | A1 | 6/2012 | Khullar et al. |
| 2014/0292385 | A1* | 10/2014 | Bahl ...................... H03K 3/012 327/144 |
| 2015/0137862 | A1 | 5/2015 | Bahl et al. |

OTHER PUBLICATIONS

International Search Report and Written Opinion—PCT/US2023/063577—ISA/EPO—dated Jul. 3, 2023.

* cited by examiner

*Primary Examiner* — Tomi Skibinski
(74) *Attorney, Agent, or Firm* — Loza & Loza, LLP

(57) ABSTRACT

An aspect of the disclosure relates to an integrated circuit (IC). The IC includes a first set of test clock controllers (TCCs) including a first set of clock outputs, respectively; and a first set of functional cores including a first set of clock inputs coupled to the first set of clock outputs of the first set of TCCs, respectively.

29 Claims, 8 Drawing Sheets

INTEGRATED FUNCTIONAL AND DESIGN FOR TESTABILITY (DFT) CLOCK DELIVERY ARCHITECTURE

FIELD

Aspects of the present disclosure relate generally to integrated circuit (IC) clock architectures, and in particular, to an integrated functional and design for testability (DFT) clock delivery architecture.

BACKGROUND

An integrated circuit (IC), such as a system on chip (SOC), typically includes a set of functional cores, each of which may have many functional circuits. Each functional circuit may include combinational logic and/or a memory circuit, with many logic and memory components. During IC fabrication, such logic and memory components may be subjected to imperfections in the fabrication process. For example, such imperfections may include a node stuck-at-fault (e.g., stuck-at-one or stuck-at-zero), a connection between devices that is open, a connection between devices having excessive resistance, a node including excessive parasitic capacitance and/or resistance, and others.

To validate/reject ICs, an IC typically includes design for testability (DFT) circuitry to scan-in test vectors, perform at-functional-speed tests on, and scan-out resulting output test vectors to and from functional circuits under sequential control of test clocks. When the IC has been validated, the operations of the functional circuits are sequentially controlled by a functional clock.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an integrated circuit (IC). The IC includes a first set of test clock controllers (TCCs) including a first set of clock outputs, respectively; and a first set of functional cores including a first set of clock inputs coupled to the first set of clock outputs of the first set of TCCs, respectively.

Another aspect of the disclosure relates to a method. The method includes providing, by a set of test clock controllers (TCCs), a set of at-speed clocks to a set of functional cores in response to a first test mode of operation, respectively; and providing, by the set of TCCs, the set of at-speed clocks to the set of functional cores in response to a functional mode of operation, respectively.

Another aspect of the disclosure relates to an apparatus. The apparatus includes means for providing a set of at-speed clocks to a set of functional cores in response to a first test mode of operation, respectively; and means for providing the set of at-speed clocks to the set of functional cores in response to a functional mode of operation, respectively.

Another aspect of the disclosure relates to a wireless communication device. The wireless communication device includes at least one antenna; a transceiver coupled to the at least one antenna; a set of digital signal processing cores coupled to the transceiver; and a clock delivery system, including a first set of test clock controllers (TCCs) including a set of clock outputs coupled to a set of clock inputs of the set of digital signal processing cores, respectively.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, wellknown structures and components are shown in block diagram form in order to avoid obscuring such concepts.

Figure 1:
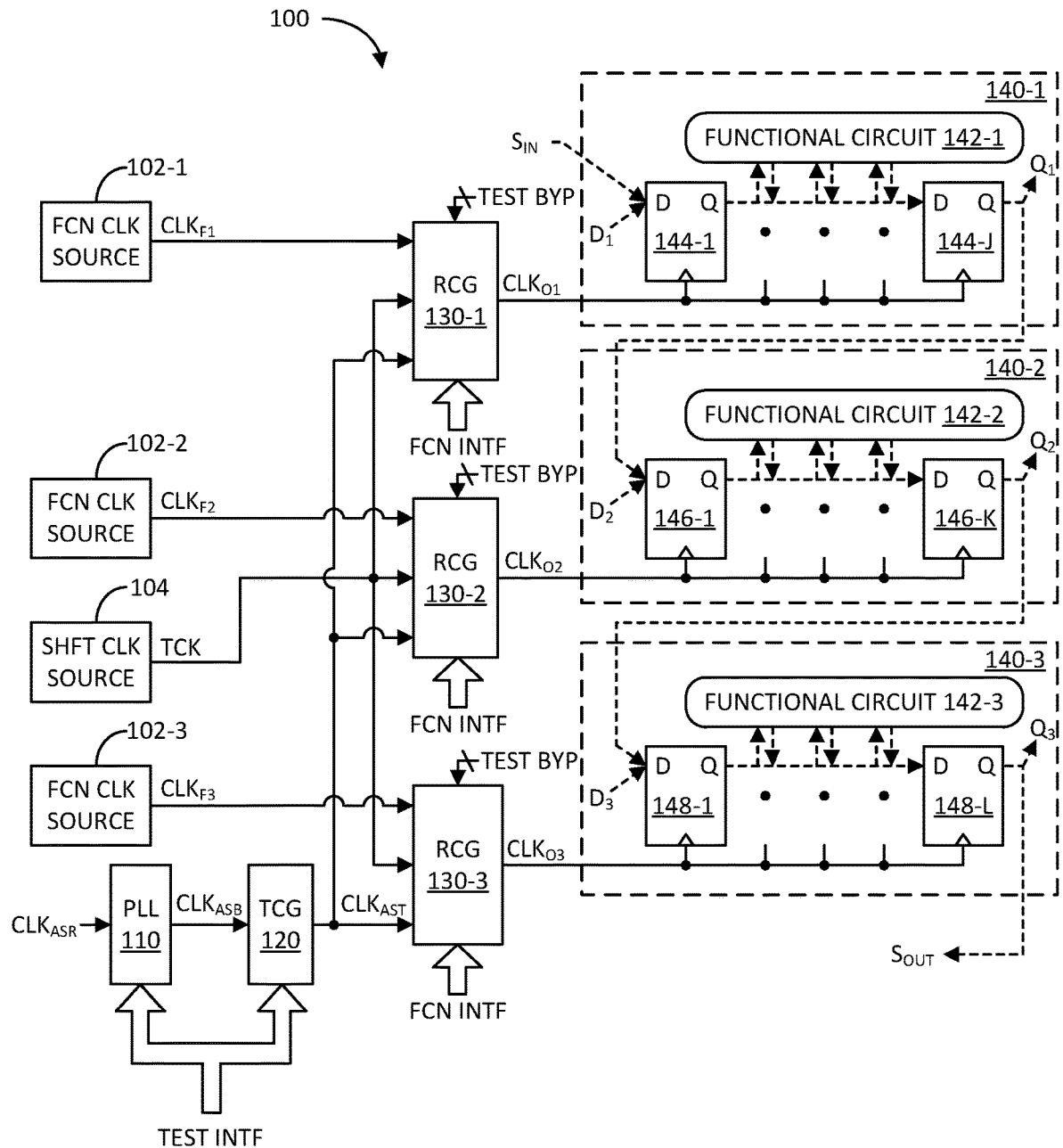
FIG. 1 illustrates a block diagram of an example integrated circuit (IC) including an example clock delivery architecture in accordance with an aspect of the disclosure.

FIG. 1 illustrates a block diagram of an example integrated circuit (IC) 100 in accordance with an aspect of the disclosure. In this example, the IC 100 includes a set of functional clock sources 102-1 to 102-3, a shift clock source 104, a test phase locked loop (PLL) 110, a test clock generator (TCG) 120, a set of root clock generators (RCGs) 130-1 to 130-3, and a set of functional cores 140-1 to 140-3. Although the number of functional clock sources 102-1 to 102-3, number of RCGs 130-1 to 130-3, and number of functional cores 140-1 to 140-3 are each three (3) in this example, it shall be understood that the number of functional clock sources, RCGs, and functional cores may vary depending on the complexity and functionality of the IC 100.

The term "functional" as used herein means that the functional cores 140-1 to 140-3 are operating on user application data (e.g., user data logic processing, user data error correction encoding and decoding, user data encrypting and decrypting, user data scrambling and descrambling, user data compressing and decompressing, user data storing and retrieving, etc.). The term "test" as used herein means that the functional cores 140-1 to 140-3 are operating on a test sequence (e.g., test data vectors generated by automatic test pattern generators (ATPG)) to test and validate/reject the operations of the functional cores 140-1 to 140-3. An IC may include specific hardware for the purpose of diagnostic testing of functional cores, which is typically referred to as design for testability (DFT) hardware.

The set of functional clock sources 102-1, 102-2, and 102-3 are configured to generate functional clocks $CLK_{F1}$, $CLK_{F2}$, and $CLK_{F3}$, respectively. A clock is a periodic signal (e.g., a substantially square wave) used to sequentially propagate data within an associated functional core. The frequencies of the functional clocks $CLK_{F1}$, $CLK_{F2}$, and $CLK_{F3}$ are set to the functional data rate (or higher) at which the functional cores 140-1, 140-2, and 140-3 operate, respectively. As an example, the frequencies of the functional clocks $CLK_{F1}$, $CLK_{F2}$, and $CLK_{F3}$ may be at 200 mega Hertz (MHz), 400 MHz, and 600 MHz, respectively; which translates to functional data rates of 200 mega bits per second (Mbit/s), 400 Mbit/s, and 600 Mbit/s for the functional cores 140-1, 140-2, and 140-3, respectively.

The shift clock source 104, which is a DFT hardware, is configured to generate a shift test clock TCK. As discussed further herein, during a scan phase of testing of the functional cores 140-1 to 140-3, the test clock TCK is configured to shift-in an input test data vector to the functional cores 140-1 to 140-3, and to shift-out the resulting output test data vector from the functional cores 140-1 to 140-3. The frequency of the test clock TCK is typically lower than the frequencies of the functional clocks $CLK_{F1}$, $CLK_{F2}$, and $CLK_{F3}$ to reduce the likelihood that there is no error in scanning in the input test vector and scanning out the output test vector to and from the functional cores 140-1 to 140-3, respectively. As an example, the frequency of the test clock TCK may be at 100 MHz or lower. The test clock TCK may also be used in a capture phase to perform testing of the functional cores 140-1 to 140-3 at data rates lower than the operational data rates of the functional cores 140-1 to 140-3. The shift clock source 104 may be implemented as part of the IC 100 as shown, or may be an external clock source as part of a diagnostic test equipment. Alternatively, the shift clock source 104 may be implemented as part of the IC 100, and there may be an additional external shift clock source as part of a diagnostic test equipment, as discussed further herein.

The test PLL 110, which is also a DFT hardware, is configured to phase/frequency lock to a reference clock $CLK_{ASR}$ to generate an at-functional-speed (or "at-speed" hereinafter) base clock $CLK_{ASB}$. As an example, the reference clock $CLK_{ASR}$ may be generated by a stable crystal oscillator, and may cycle with a frequency of 50 MHz. As another example, the test PLL 110 may frequency multiply the reference clock $CLK_{ASR}$ by a factor dictated by control signals received via a test interface to generate the at-speed base clock $CLK_{ASB}$. As an example, the test interface may be compliant with any of the Joint Test Action Group (JTAG) standards. The TCG 120, which is also a DFT hardware, may be configured to generate an at-speed test clock $CLK_{AST}$ based on control signals received from the test interface.

Considering the example above, to test the functional core 140-1 at its rated speed or functional data rate in the capture phase, the test interface provides control signals to the test PLL 110 and TCG 120 to generate the at-speed test clock $CLK_{AST}$ with a frequency of 200 MHz. Similarly, to test the functional core 140-2 at its rated speed or functional data rate in the capture phase, the test interface provides control signals to the test PLL 110 and TCG 120 to generate the at-speed test clock $CLK_{AST}$ with a frequency of 400 MHz. And, to test the functional core 140-3 at its rated speed or functional data rate in the capture phase, the test interface provides control signals to the test PLL 110 and TCG 120 to generate the at-speed test clock $CLK_{AST}$ with a frequency of 600 MHz.

The RCG 130-1 is configured to receive the functional clock $CLK_{F1}$ from the functional clock source 102-1, the shift test clock TCK from the shift clock source 104, and the at-speed test clock $CLK_{AST}$ from the TCG 120, and generate an output clock $CLK_{O1}$ from a selected one of the $CLK_{F1}$, TCK, and $CLK_{AST}$ based on control signals received via a functional interface and a test bypass signal. For example, in functional mode, the RCG 130-1 may select the functional clock $CLK_{F1}$ and optionally frequency divide the functional clock $CLK_{F1}$ to generate the output clock $CLK_{O1}$ based on control signals received from the functional interface. As another example, the frequency of the functional clock $CLK_{F1}$ may be 600 MHz; and thus, to generate the output clock $CLK_{O1}$ at the functional data rate of functional core 140-1 at a frequency of 200 MHz, the RCG 130-1 may frequency divide the functional clock $CLK_{F1}$ by a divider ratio of three (3). In test mode, the RCG 130-1 merely serves as a bypass to output the selected shift test clock TCK or the at-speed test clock $CLK_{AST}$ as the output clock $CLK_{O1}$ based on a test bypass signal.

The RCGs 130-2 and 130-3 operate in a manner similar to RCG 130-1. That is, the RCG 130-2 is configured to receive the functional clock $CLK_{F2}$ from the functional clock source 102-2, the shift test clock TCK from the shift clock source 104, and the at-speed test clock $CLK_{AST}$ from the TCG 120, and generate an output clock $CLK_{O2}$ from a selected one of the $CLK_{F2}$ (which may be frequency divided), TCK, and $CLK_{AST}$ based on control signals received from the functional interface and the test bypass signal. Similarly, the RCG 130-3 is configured to receive the functional clock $CLK_{F3}$ from the functional clock source 102-3, the shift test clock TCK from the shift clock source 104, and the at-speed test clock $CLK_{AST}$ from the TCG 120, and generate an output clock $CLK_{O3}$ from a selected one of the $CLK_{F3}$ (which may be frequency divided), TCK, and $CLK_{AST}$ based on control signals received from the functional interface and the test bypass signal.

The functional cores 140-1, 140-2, and 140-3 include scan chains (cascaded sets of flip-flops) 144-1-144-J, 146-1-146-K, and 148-1-148-L, respectively; where J, K, and L are positive integers. The functional cores 140-1, 140-2, and 140-3 further include functional circuits 142-1, 142-2, and 142-3 coupled to the scan chains 144-1-144-J, 146-1-146-K, and 148-1-148-L, respectively. Each of the functional circuits 142-1, 142-2, and 142-3 may be combinational logic, memory circuit/cells, or any combination thereof. The scans chains 144-1-144-J, 146-1-146-K, and 148-1-148-L are also cascaded with each other from a scan input $S_{IN}$ to a scan output Spur. That is, the data output (Q) of the last flip-flop 144-J of the scan chain 144-1-144-J of the functional core 140-1 is coupled to the data input (D) of the first flip-flop 146-1 of scan chain 146-1-146-K of the functional core 140-2; and the data output (Q) of the last flip-flop 146-K of the scan chain 146-1-146-K of the functional core 140-2 is coupled to the data input (D) of the first flip-flop 148-1 of the scan chain 148-1-146-L of the functional core 140-3.

The scan chains 144-1-144-J, 146-1-146-K, and 148-1-148-L include clock inputs coupled to the outputs of the RCGs 130-1, 130-2, and 130-3 to receive the output clocks $CLK_{O1}$, $CLK_{O2}$, and $CLK_{O3}$ therefrom, respectively. Although not shown, the functional cores 140-1 to 140-3 may be coupled to the test interface to configure the functional cores 140-1 to 140-3 between various modes, such as test shift mode, test at-speed capture mode, test slow speed capture mode, or functional mode based on control signals received via the test interface.

Figure 2:
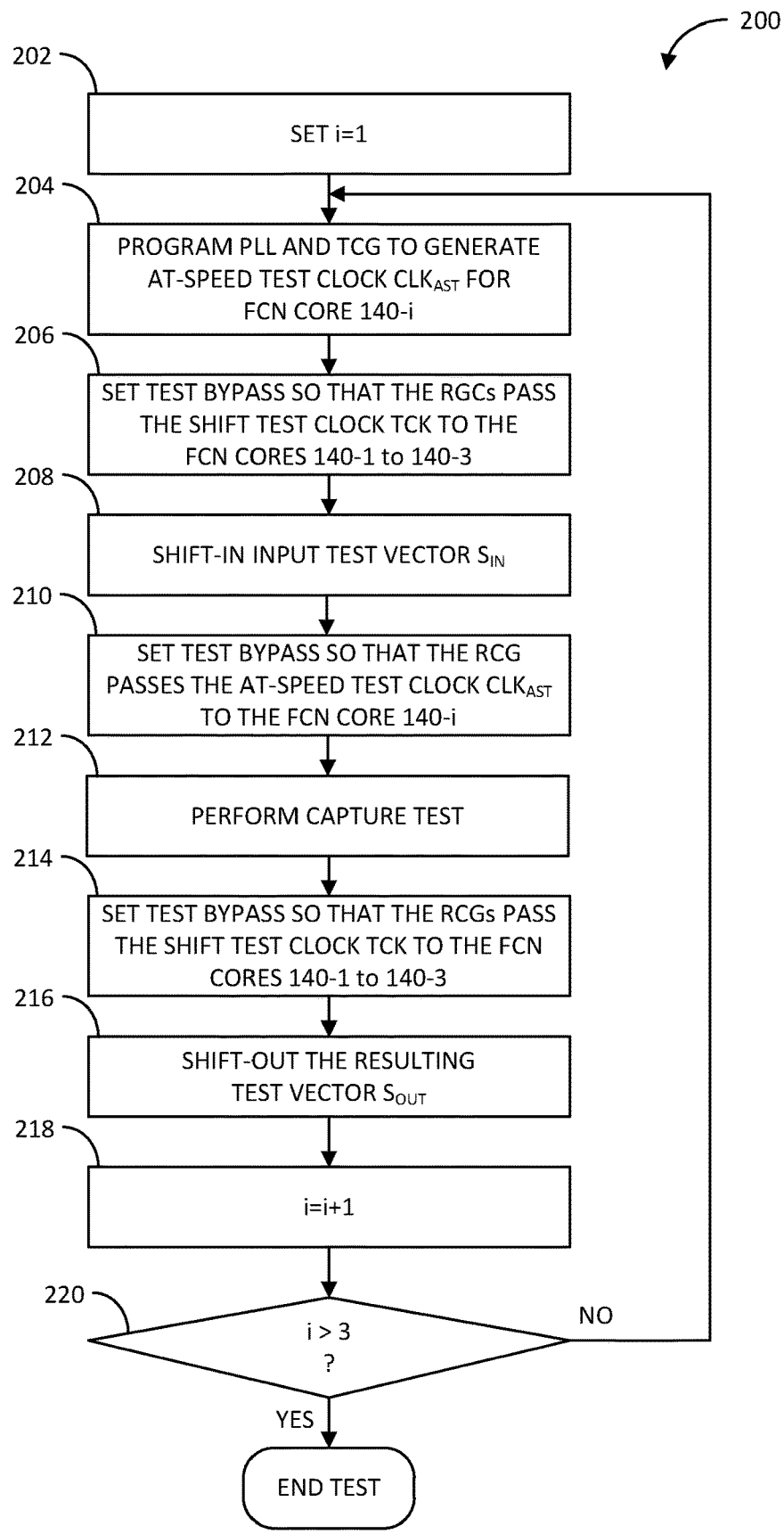
FIG. 2 illustrates a flow diagram of an example method of testing functional cores of the integrated circuit (IC) of FIG. 1 in accordance with another aspect of the disclosure.

FIG. 2 illustrates a flow diagram of an example method 200 of testing the functional cores 140-1 to 140-3 of the IC 100 in accordance with another aspect of the disclosure. The method 200 includes initiating a variable "i" to one (1) (block 202). The variable "i" identifies the functional core 140-i that is currently undergoing a test. Accordingly, the first functional core to be tested is functional core 140-1. As, in this example, the functional cores 140-1 to 140-3 operate at different frequencies or data rates, and there is only a single at-speed test clock $CLK_{AST}$ in this centralized test clock delivery architecture, each of the functional cores 140-1 to 140-3 has to be tested one at a time.

Then, according to the method 200, control signals via the test interface are sent to the test PLL 110 and TCG 120 to set the frequency of the at-speed test clock $CLK_{AST}$ to the operating frequency (functional data rate) of the functional core 140-1 (e.g., 200 MHz) (block 204). Further, according to the method 200, the test bypass signal is set so that the RCGs 130-1 to 130-3 output the shift test clock TCK as their respective output clocks $CLK_{O1}$ to $CLK_{O3}$ (block 206). The method 200 further includes shifting-in the input test vector via the scan input $S_{IN}$ to populate the scan chain 144-1 to 144-J of the current functional core 140-1 under synchronous control of the shift test clock (block 208). The input test vector may be generated internally within the IC 100, for example, by an ATPG. Alternatively, the input test vector may be generated externally of the IC 100, for example, by a diagnostic test equipment. It shall be understood that the functional cores 140-1 to 140-3 are preconfigured via the test interface to cascade the scan chains 144-1-144-J, 146-1-146-K, and 148-1-148-L from a scan perspective prior to the inputting the test vector per block 208.

Then, according to the method 200, the test bypass signal is set so that at least the RCG 130-1 outputs the at-speed test clock $CLK_{AST}$ as its output clocks $CLK_{O1}$ (block 210). Using the at-speed test clock $CLK_{AST}$, the method 200 includes performing a capture test on the functional core 140-1 under synchronous control of the at-speed clock $CLK_{O1}$ (block 212). It shall be understood that the functional core 140-1, and more specifically, the coupling of the scan chain 144-1 to 144-J to the functional circuit 142-1 is configured to perform the desired capture test on the functional circuit 142-1 prior to initiating the capture test per block 212. Further, according to the method 200, the test bypass signal is set so that the RCGs 130-1 to 130-3 again output the shift test clock TCK as their respective output clocks $CLK_{O1}$ to $CLK_{O3}$, respectively (block 214). The method 200 further includes shifting-out the resulting output test vector via the scan output Sour under synchronous control of the shift test clock TCK (block 216). It shall be understood that the functional cores 140-1 to 140-3 are preconfigured via the test interface to cascade the scan chains 144-1-144-J, 146-1-146-K, and 148-1-148-L from a scan perspective prior to scanning out the output test vector per block 216. The output test vector may be sent to a diagnostic test component internal to the IC 100 for validation purpose. Alternatively, the output test vector may be sent externally to the IC 100, for example, to a diagnostic test equipment for validation purpose.

Then, according to the method 200, the variable "i" is incremented by one (1) (block 218). This sets the next functional core (e.g., 140-2) as the current functional core for testing purpose. Additionally, the method 200 checks whether all the functional cores have been tested by determining whether the variable "i" is greater than the number of functional cores to be tested (e.g., three (3) in this example) (block 220). If the variable "i" is determined not to be greater than three (3) in block 220, the method 200 returns to block 204 to perform the test operations pursuant to blocks 204 to 216 for the next functional core to be tested. If the variable "i" is determined to be greater than three (3) in block 220, all functional cores have been tested, and the test may end.

To briefly address the functional operation of the IC 100, the control signals supplied via the function interface configures the set of RCGs 130-1 to 130-3 to output (and optionally frequency divide) the functional clocks $CLK_{F1}$ to $CLK_{F3}$ as output clocks $CLK_{O1}$ to $CLK_{O3}$, respectively. In addition, control signals are sent via the test and/or functional interface to configure the functional cores 140-1 to 140-3 for functional operation, where user data $D_1$ to $D_3$ are provided to the data inputs of the functional cores 140-1 to 140-3, sent to the functional circuits 142-1 to 142-2 via the sets of flip-flops 144-1 to 144-J, 146-1 to 146-K, and 148-1 to 148-L, to generate output data $Q_1$ to $Q_3$ under synchronous control of the output (functional) clocks $CLK_{O1}$ to $CLK_{O3}$, respectively. As the functional cores 140-1 to 140-3 are driven based on different functional clocks $CLK_{F1}$ to $CLK_{F3}$, the functional cores 140-1 to 140-3 operate asynchronous with respect to each other.

With regard to DFT, there are several drawbacks with the centralized test clock delivery architecture implemented in IC 100. First, as apparent from the method 200 previously discussed, the functional cores 140-1 to 140-3 operating at different frequencies need to be tested one at a time. This is because there is one (1) centralized at-speed test clock generator (PLL 110 and TCG 120) for the set of functional cores 140-1 to 140-3. The serial testing of the functional cores 140-1 to 140-3 causes the time to test the IC 100 to be relatively large, especially if there are a large number of functional cores to be tested by the centralized clock generator (PLL 110 and TCG 120).

Another drawback stems from the fact that the at-speed test clock $CLK_{AST}$ is provided to all of the set of scan chains 144-1-144-J, 146-1 to 146-K, and 148-1 to 148-L of the functional cores 140-1 to 140-3, respectively. This means that in test mode, the functional cores 140-1 to 140-3 are considered synchronous, and require timing closure to be done over a large set of flip-flops, especially if there are many functional cores receiving the same at-speed test clock. For designers, achieving timing closure on so many flip-flops may be extremely complex and challenging. In contrast, in functional mode, the functional cores 140-1 to 140-3 are operated asynchronous.

Another drawback of the centralized test clock delivery architecture is that the at-speed test clock $CLK_{AST}$ is susceptible to significant clock divergence. That is, the at-speed test clock $CLK_{AST}$ takes different paths to each of the scan chains 144-1-144-J, 146-1-146-K, and 148-1-148-L of the functional cores 140-1 to 140-3, respectively. If there are process-voltage-temperature (PVT) variations in these different paths, the timing closure yield may be severely impacted. An additional drawback relates to clock depth. When the at-speed test clock $CLK_{AST}$ is provided to too many flip-flops, it is difficult for the at-speed test clock $CLK_{AST}$ reaching the scan chains 144-1-144-J, 146-1-146-K, and 148-1-148-L to meet the duty cycle requirement. As a result, the centralized test clock delivery architecture is also susceptible to duty cycle distortion. Another drawback has to do with the complexity in the routing the at-speed test clock $CLK_{AST}$ from the TCG 120 to the scan chains 144-1-144-J, 146-1-146-K, and 148-1-148-L of the functional cores 140-1 to 140-3, respectively.

Figure 3:
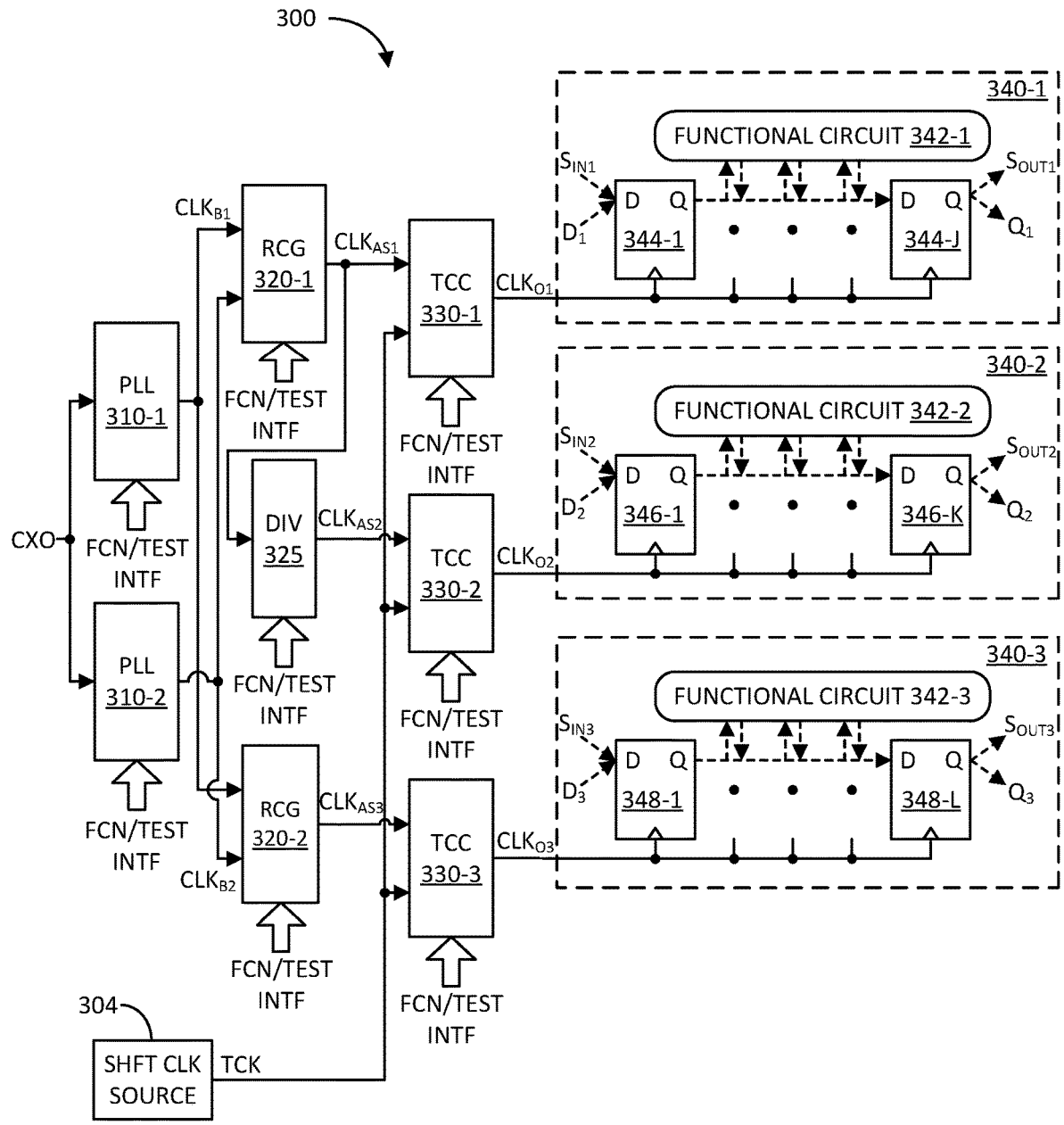
FIG. 3 illustrates a block diagram of another example integrated circuit (IC) including another example clock delivery architecture in accordance with another aspect of the disclosure.

FIG. 3 illustrates a block diagram of another example integrated circuit (IC) 300 in accordance with another aspect of the disclosure. In summary, the IC 300 includes a test clock controller (TCC) for each functional core. That is, each TCC selectively supplies a functional clock and an at-speed test clock to a corresponding functional core. This feature functionally aligns the test clock with the functional clock. As a result of this feature, a plurality of functional cores may be tested at the same time, significantly reducing the time required to tests the functional cores compared to the centralized test clock delivery architecture of IC 100.

Another benefit of the TCC to functional core one-to-one association is that timing closure is easier met as there may not be any cross-linking between functional cores. Thus, the at-speed test clock provided to a functional core requires timing closure for the scan chain flip-flops in the corresponding functional core, not across many functional cores as in IC 100. For example, in IC 100, timing closure needs to be met across scan chains 144-1-144-J, 146-1-146-K, and 148-1-148-L, as the at-speed test clock $CLK_{AST}$ is provided to all of these scan chains, and the scan chains are linked or cascaded with each other. Thus, timing closure needs to be met across J+K+L flip-flops. Whereas in IC 300, as discussed in more detail further herein, there is a TCC associated with each of the scan chains, and there is no cross-linking between the scan chains. Thus, timing closure is met across J flip-flops for functional core 140-1, K flip-flops for functional core 140-2, and L flip-flops for functional core 140-3.

An additional benefit of having a one-to-one correspondence between a TCC and a functional core is that clock divergence is significantly reduced. For example, in IC 100, the at-speed test clock $CLK_{AST}$ diverges at the corresponding inputs of the RCGs 130-1 to 130-3. Thus, if there are significant PVT variations across any paths from the inputs of the RCGs 130-1 to 130-3 to the scan chains 144-1-144-J, 146-1-146-K, and 148-1-148-L, the yield in manufacturing acceptable ICs may be significantly impacted. As discussed in more detail herein, the TCCs provide separate at-speed test clocks to the functional cores. Thus, the only clock divergence occurs within each functional core with respect to the corresponding at-speed test clock.

A further benefit of having a one-to-one association between a TCC and a functional core is that the clock depth is significantly reduced. As previously discussed, when a clock is provided to too many flip-flops, there is a tendency for the duty cycle of the clock to be distorted. For example, in IC 100, as previously discussed, the at-speed test clock $CLK_{AST}$ is provided to J+K+L flip-flops of the functional cores 140-1, 140-2, and 140-3, respectively. Whereas, in IC 300, as discussed in more detail further herein, each TCC supplies an at-speed test clock to a corresponding functional core; such as a TCC to supply an at-speed test clock to the J flip-flops of functional core 140-1; another TCC to supply another at-speed test clock to the K flip-flops of functional core 140-2; and yet another TCC to supply yet another at-speed test clock to the L flip-flops of functional core 140-3. Accordingly, because each of the at-speed test clocks are provided to less flip-flops in IC 300, the at-speed clocks are less susceptible to duty cycle distortion.

Yet another benefit of having a TCC for each functional core is that the complexity of the routing the at-speed clocks to the functional cores 140-1 to 140-3 is significantly less. For example, in IC 100, the at-speed test clock $CLK_{AST}$ has to be routed from the TCG 120, via the set of RCGs 130-1 to 130-3, and to the scan chains 144-1-144-J, 146-1-146-K, and 148-1-148-L. In IC 300, as discussed in more detail further herein, an TCC may route an at-speed clock directly to a functional core; thereby, significantly reducing the routing complexity of the clock as compared to IC 100.

Finally, the number of external clocks may be significantly reduced with the clock delivery architecture of IC 300. For example, in IC 100, a dedicated external clock $CLK_{ASR}$ is needed to generate the at-speed test clock $CLK_{AST}$ for the functional cores 140-1 to 140-3. Whereas, in IC 300, the at-speed test clock and the functional clock are one in the same; resulting in less external clocks needed to effectuate the testing of the functional cores.

In particular, the IC 300 includes a set of one or more phase locked loops (PLLs) 310-1 and 310-2 (e.g., two (2) in this example, but could include a different number of PLLs). The IC 300 additionally includes a set of one or more root clock generators (RCGs) 320-1 and 320-2 (e.g., similarly two (2) in this example, but could include a different number of RCGs). Further, the IC 300 includes a clock frequency divider 325, a shift clock source 304, and a set of test clock controllers (TCCs) 330-1 to 330-3 (e.g., three (3) in this example, but could include a different number of TCCs). Also, the IC 300 includes a set of functional cores 340-1 to 340-3 (e.g., three (3) in this example, but could include a different number of functional cores).

As discussed in more detail further herein, the shift clock source 304 is configured to generate a shift test clock TCK, which may be used to shift-in input test vectors $S_{IN1}$ to $S_{IN3}$ into the functional cores 340-1 to 340-3, shift-out the resulting output test vectors $S_{OUT1}$ to $S_{OUT3}$ from the functional cores 340-1 to 340-3, and optionally, to perform slow speed testing of the functional cores 340-1 to 340-3 (e.g., at a clock speed lower than the rated or functional clock speeds of the functional cores 340-1 to 340-3), respectively. The shift clock source 304 includes a clock output, at which the shift test clock TCK is produced, coupled to respective first clock inputs of the set of TCCs 330-1 to 330-3.

The set of PLLs 310-1 and 310-2 include respective clock inputs configured to receive a reference clock CXO, which may be generated by a substantially stable crystal oscillator. The PLL 310-1 to 310-2 include a combined functional and test interface (a "functional/test interface" hereinafter) to receive control signals based on the at-speed clock frequency requirements of the functional cores 340-1 to 340-3, respectively. As an example, the test portion of the functional/test interface may be compliant with any of the Joint Test Action Group (JTAG) standards. The PLLs 310-1 and 310-2 are configured to generate at-speed base clocks $CLK_{B1}$ and $CLK_{B2}$, respectively. In generating the at-speed base clocks, the PLLs 310-1 and 310-2 may generate feedback clocks phase/frequency locked to the reference clock CXO, and frequency divide the at-speed base clocks $CLK_{B1}$ and $CLK_{B2}$ to generate the feedback clocks based on control signals (e.g., specifying divider ratios) received via the functional/test interface. Thus, the at-speed base clocks $CLK_{B1}$ and $CLK_{B2}$ cycles with frequencies being the corresponding feedback divider ratios multiplied by the frequency of the reference clock CXO, respectively. The PLLs 310-1 and 310-2 include clock outputs, at which the at-speed base clocks $CLK_{B1}$ and $CLK_{B2}$, coupled to both clock inputs of the RCGs 320-1 and 320-2, respectively.

The set of RCGs 320-1 and 320-2 are configured to select one of its input at-speed base clocks $CLK_{B1}$ and $CLK_{B2}$ for outputting based on control signals received via the functional/test interface. Optionally, the set of RCGs 320-1 and 320-2 may include clock frequency dividers with programmable divider ratios based on control signals received via the functional/test interface. Accordingly, the RCGs 320-1 and 320-2 are configured to generate at-speed clocks $CLK_{AS1}$ and $CLK_{AS3}$ cycling at frequencies based on the frequencies of the selected at-speed base clocks $CLK_{B1}$ and $CLK_{B2}$ and optionally divided by the programmed divider ratios. The RCGs 320-1 and 320-2 include clock outputs, at which the at-speed clocks $CLK_{AS1}$ and $CLK_{AS3}$ are generated, coupled to second clock inputs of TCCs 330-1 and 330-3, respectively. In this example, the output of the RCG 320-1 is further coupled to a clock input of the clock frequency divider 325.

The clock frequency divider 325 is configured to receive and frequency divide the at-speed clock $CLK_{AS1}$ from the RCG 320-1 based on control signals received from the functional/test interface to generate another at-speed clock $CLK_{AS2}$. Thus, in this configuration, an additional at-speed clock $CLK_{AS2}$ may be generated without requiring an additional RCG to do so. As an example, if the functional core 340-1 operates at an at-speed clock frequency of 400 MHz and the functional core 340-2 operates at an at-speed clock frequency of 200 MHz, then the RCG 320-1 may be configured to generate the at-speed clock $CLK_{AS1}$ with a frequency of 400 MHz, and the clock frequency divider 325 may be configured to frequency divide the at-speed clock $CLK_{AS1}$ by a divider ratio of two (2) to generate the at-speed clock $CLK_{AS2}$. Further, in accordance with this example, if the functional core 340-3 operates at an at-speed clock frequency of 300 MHz, it may be less complex for the clock frequency divider 325 to divide by two (2) to generate the at-speed clock $CLK_{AS2}$, instead of having its input coupled to the output of the RCG 320-2, which would require a divider ratio of 1.5 to generate the at-speed clock $CLK_{AS2}$. The clock frequency divider 325 includes a clock output, at which the at-speed clock $CLK_{AS2}$ is generated, coupled to a second clock input of the TCC 330-2.

The set of TCCs 330-1, 330-2, and 330-3 are configured to select the input clocks $CLK_{AS1}$/TCK, $CLK_{AS2}$/TCK, and $CLK_{AS3}$/TCK to generate output clocks $CLK_{O1}$, $CLK_{O2}$, and $CLK_{O3}$ based on control signals received from the functional/test interface, respectively. The TCCs 330-1 to 330-3 include clock outputs, at which the output clocks $CLK_{O1}$, $CLK_{O2}$, and $CLK_{O3}$ are generated, coupled to clock inputs of scan chains (cascaded sets of flip-flops) 344-1-344-J, 346-1-346-K, and 348-1-348-L of functional cores 340-1, 340-2, and 340-3, respectively.

In addition to the scan chains 344-1-344-J, 346-1-346-K, and 348-1-348-L, the functional cores 340-1, 340-2, and 340-3 include functional circuits 342-1, 342-2, and 342-3 coupled to the scan chains 344-1-344-J, 346-1-346-K, and 348-1-348-L. Each of the functional circuits 142-1, 142-2, and 142-3 may be a combinational logic, memory circuit/cells, or any combination thereof. Although not shown, the functional cores 340-1 to 340-3 may also be coupled to the functional/test interface for receiving control signals to configure the functional cores 340-1 to 340-3 in functional mode or the various test modes.

For example, in functional mode, the scan chains 344-1-344-J, 346-1-346-K, and 348-1-348-L are configured to receive input functional data $D_1$, $D_2$, and $D_3$, provide the functional data $D_1$, $D_2$, and $D_3$ to the functional circuits 342-1, 342-2, and 342-3, receive the resulting output functional data $Q_1$, $Q_2$, and $Q_3$ from the functional circuits 342-1, 342-2, and 342-3, and output the functional data $Q_1$, $Q_2$, and $Q_3$, all under sequential control of the output clocks $CLK_{O1}$, $CLK_{O2}$, and $CLK_{O3}$, which are based on the at-speed clocks $CLK_{AS1}$, $CLK_{AS2}$, and $CLK_{AS3}$, respectively.

In test shift mode, the inputs of the scan chains 344-1-344-J, 346-1-346-K, and 348-1-348-L are configured to receive input test vectors $S_{IN1}$, $S_{IN2}$, and $S_{IN3}$, internally propagate the input test vectors $S_{IN1}$, $S_{IN2}$, and $S_{IN3}$, and output the resulting output test vectors $S_{OUT1}$, $S_{OUT2}$, and $S_{OUT3}$, all under the sequential control of the output clocks $CLK_{O1}$, $CLK_{O2}$, and $CLK_{O3}$, which are based on the shift test clock TCK, respectively. In one implementation, the set of TCCs 330-1 to 330-3 may also provide the input scan vectors $S_{IN1}$, $S_{IN2}$, and $S_{IN3}$ to the scan chains 344-1-344-J, 346-1-346-K, and 348-1-348-L of the functional cores 340-1, 340-2, and 340-3, respectively.

In test capture mode, the scan chains 344-1-344-J, 346-1-346-K, and 348-1-348-L are coupled to the functional circuits 342-1, 342-2, and 342-3 to provide the latter the input scan vectors $S_{IN1}$, $S_{IN2}$, and $S_{IN3}$, and receive therefrom the resulting output scan vectors $Q_1$, $Q_2$, and $Q_3$, all under the sequential control of the output clocks $CLK_{O1}$, $CLK_{O2}$, and $CLK_{O3}$, which are based on the at-speed clocks $CLK_{AS1}$, $CLK_{AS2}$, and $CLK_{AS3}$, respectively. Although the test shift and capture modes are described to exemplify the operations of the functional cores 340-1 to 340-3, it shall be understood that the functional cores 340-1 to 340-3 may be configured in other test modes, such as a slow clock capture mode where the functional circuits 342-1, 342-2, and 342-3 are tested at a clock speed of the shift test clock TCK, or a scan chain test mode where the scan chains 344-1-344-J, 346-1-346-K, and 348-1-348-L are tested at the at-speed clock speeds.

Figure 4:
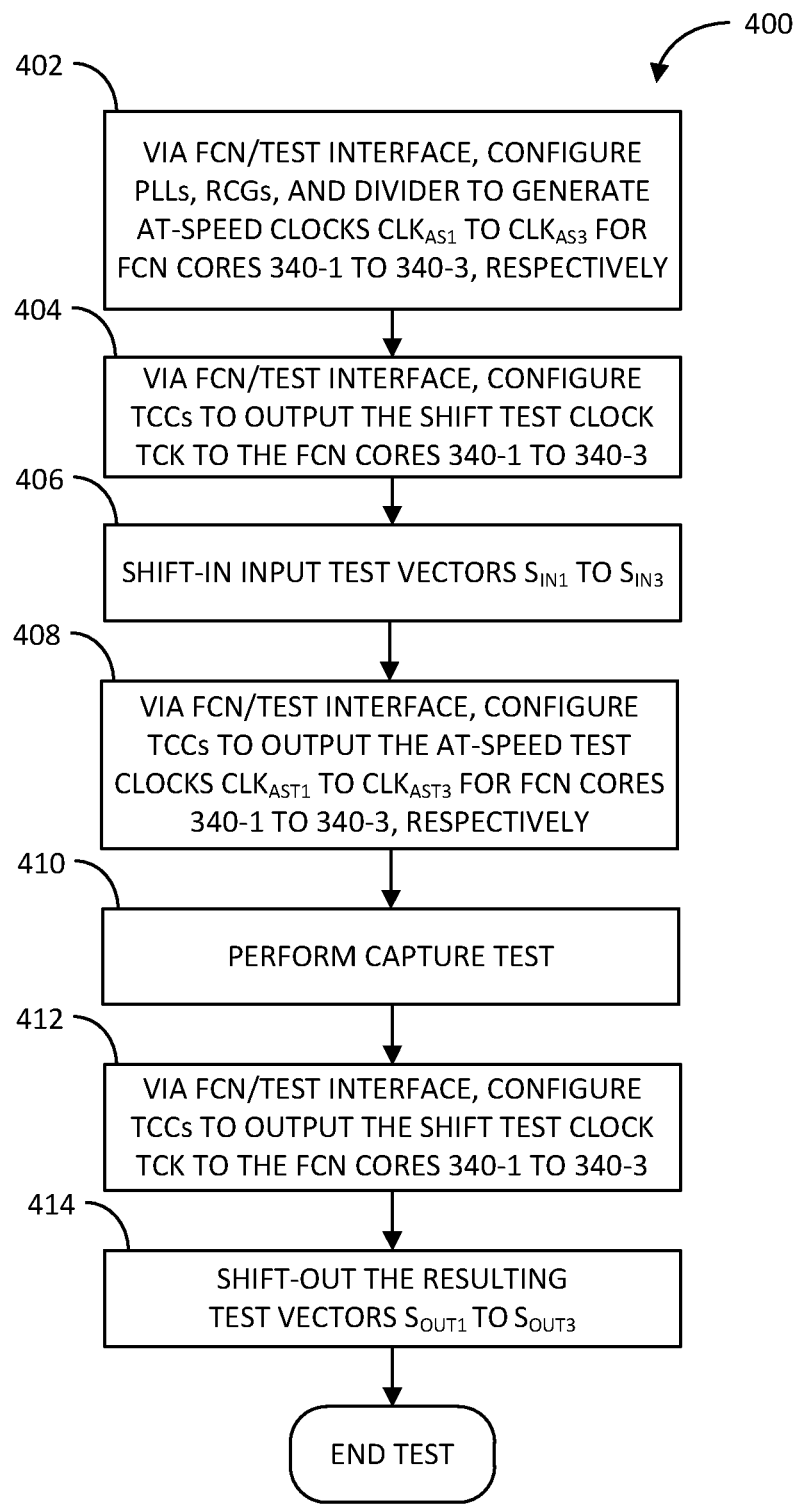
FIG. 4 illustrates a flow diagram of an example method of testing functional cores of the integrated circuit (IC) of FIG. 3 in accordance with another aspect of the disclosure.

FIG. 4 illustrates a flow diagram of an example method 400 of testing functional cores 340-1 to 340-3 of the IC 300 in accordance with another aspect of the disclosure. In this example, the functional cores 340-1 to 340-3 are tested simultaneously or at the same time. However, it shall be understood that that the functional cores 340-1 to 340-3 may be tested one at a time, or two at a time followed by the testing of another one, or other combinations based on the number of functional cores in an IC. It shall be further understood that the method 400 need not be implemented in the order described herein.

The method 400 includes sending control signals via the functional/test interface to the PLLs 310-1 and 310-2, RCGs 320-1 and 320-2, and clock frequency divider 325 to generate at-speed clocks $CLK_{AS1}$ to $CLK_{AS3}$ at the rated functional clock speeds or data rates of the functional cores 340-1 to 340-3, respectively (block 402). Then, according to the method 400, control signals are sent via the functional/test interface to configure the TCCs 330-1 to 330-3 to select and output the shift test clock TCK as the output clocks $CLK_{O1}$ to $CLK_{O3}$, which are provided to the clock inputs of the scan chains 344-1-344-J, 346-1-346-K, and 348-1-348-L of the functional cores 340-1 to 340-3, respectively (block 404). The method 400 further includes shifting-in the input test vectors $S_{IN1}$ to $S_{IN3}$ into the scan chains 344-1-344-J, 346-1-346-K, and 348-1-348-L under the sequential control of the output clocks $CLK_{O1}$ to $CLK_{O3}$, respectively (block 406).

The method 400 further includes sending control signals to the TCCs 330-1 to 330-3 to select and output the at-speed clocks $CLK_{AS1}$ to $CLK_{AS3}$ as the output clocks $CLK_{O1}$ to $CLK_{O3}$, which are provided to the clock inputs of the scan chains 344-1-344-J, 346-1-346-K, and 348-1-348-L of the functional cores 340-1 to 340-3, respectively (block 408). Under the sequential control of the at-speed clocks $CLK_{AS1}$ to $CLK_{AS3}$, the method 400 includes performing a capture test on the functional core 340-1 to 340-3, respectively (block 410). As previously discussed, it shall be understood that the functional cores 340-1 to 340-3, and more specifically, the coupling of the scan chains 344-1-344-J, 346-1-346-K, and 348-1-348-L to the functional circuits 342-1 to 342-3 is configured to perform the intended capture test prior to initiating the capture test per block 410.

Then, according to the method 400, control signals are sent via the functional/test interface to configure the TCCs 330-1 to 330-3 to select and output the shift clock TCK as the output clocks $CLK_{O1}$ to $CLK_{O3}$, which are provided to the clock inputs of the scan chains 344-1-344-J, 346-1-346-K, and 348-1-348-L of the functional cores 340-1 to 340-3, respectively (block 412). The method 400 further includes shifting out the resulting output test vectors Soup to $S_{OUT3}$ out of the scan chains 344-1-344-J, 346-1-346-K, and 348-1-348-L under the sequential control of the output clocks $CLK_{O1}$ to $CLK_{O3}$, respectively (block 414).

To briefly address the functional operation of the IC 300, the control signals supplied by the functional/test interface configures the set of PLLs 310-1 and 310-2, set of RCGs 320-1 and 320-2, clock frequency divider 325 to output the at-speed clocks $CLK_{AS1}$ to $CLK_{AS3}$. Note that, in contrast to IC 100, the at-speed clocks $CLK_{AS1}$ to $CLK_{AS3}$ are no longer qualified as a test or functional clock because these clocks serve as both the functional and test clocks based on the current mode of operation. Thus, the test clocks are functionally aligned with the functional clocks per the clock delivery architecture in IC 300. In addition, control signals are sent via the functional/test interface to configure the functional cores 340-1 to 340-3 for functional operation, where functional data $D_1$ to $D_3$ are provided to the data inputs of the functional cores 340-1 to 340-3, sent to the functional circuits 342-1 to 342-3 via the sets of flip-flops 344-1 to 342-J, 346-1 to 346-K, and 348-1 to 348-L, to generate output data $Q_1$ to $Q_3$ under synchronous control of the output clocks $CLK_{O1}$ to $CLK_{O3}$, respectively.

With reference again to FIG. 3, there is a one-to-one correspondence between a TCC and a functional core; such as TCC 330-1 to functional core 340-1, TCC 330-2 to functional core 340-2, and TCC 330-3 to functional core 340-3. Also note that there is no cross-linking between the functional cores 340-1 to 340-3; thus, the scan chains 344-1 to 342-J, 346-1 to 346-K, and 348-1 to 348-L are independent of each other, as well as asynchronous with respect to each other in both functional and test modes. As previously discussed in detail, the benefits include the ability to test the functional cores 340-1 to 340-3 at the same time, achieving timing closure for the functional cores 340-1 to 340-3 is much easier, clock divergence is significantly reduced, clock depth is also reduced to improve duty cycle distortion at the clock inputs of the scan chains 344-1 to 342-J, 346-1 to 346-K, and 348-1 to 348-L, and the clock routing is significantly less complex.

Figure 5:
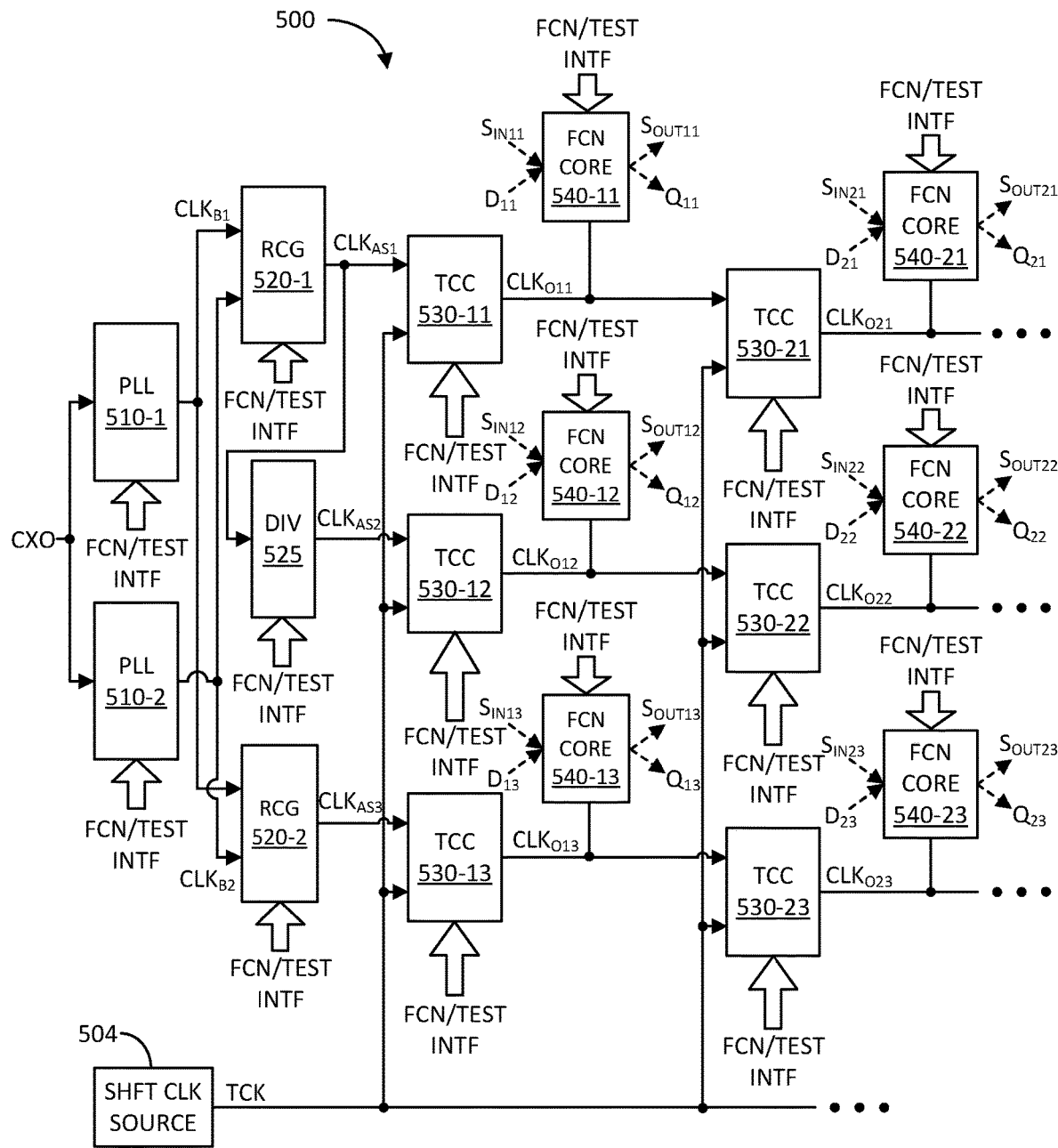
FIG. 5 illustrates a block diagram of another example integrated circuit (IC) including an example hierarchical clock delivery architecture in accordance with another aspect of the disclosure.

FIG. 5 illustrates a block diagram of another example integrated circuit (IC) 500 in accordance with another aspect of the disclosure. The functional alignment of the functional and test clock delivery architecture in IC 300 may be extended to a hierarchical TCC/functional core configuration. The IC 500 includes an example of such a hierarchical clock delivery architecture.

In particular, the IC 500 includes a set of one or more phase locked loops (PLLs) 510-1 and 510-2 (e.g., two (2) in this example, but could include any number of PLLs). The IC 500 additionally includes a set of one or more root clock generators (RCGs) 520-1 and 520-2 (e.g., similarly two (2) in this example, but could include any number of RCGs). Further, the IC 500 includes a clock frequency divider 525 and a shift clock source 504.

With regard to hierarchical levels, the IC includes a set of first hierarchical-level test clock controllers (TCCs) 530-11 to 530-13 (e.g., three (3) in this example, but could include any number of first hierarchical-level TCCs), and a set of second hierarchical-level TCCs 530-21 to 530-23 (e.g., three (3) in this example, but could include any number of second hierarchical-level TCCs). Also, the IC 500 includes a set of first hierarchical-level functional cores 540-11 to 540-13 (e.g., three (3) in this example, but could include any number of functional cores), and a set of second hierarchical-level functional cores 540-21 to 540-23 (e.g., three (3) in this example, but could include any number of functional cores). Although IC 500 includes two (2) hierarchical levels of TCCs and functional cores, it shall be understood that the IC 500 may include more than two (2) hierarchical levels of TCCs and functional cores.

The shift clock source 504 is configured to generate a shift test clock TCK, which may be used to shift-in input test vectors $S_{IN11}$ to $S_{IN23}$ into the functional cores 540-11 to 540-23, shift-out the resulting output test vectors $S_{OUT11}$ to $S_{OUT23}$, and optionally, to perform slow speed testing of the functional cores 540-11 to 540-23 (e.g., at a clock speed lower than the rated or functional clock speeds of the functional cores 540-11 to 540-23), respectively. The shift clock source 504 includes a clock output, at which the shift test clock TCK is produced, coupled to first clock inputs of the set of TCCs 530-11 to 530-23, respectively.

The set of PLLs 510-1 and 510-2 include clock inputs configured to receive a reference clock CXO, which may be generated by a substantially stable crystal oscillator. The PLL 510-1 to 510-2 include a combined functional and test interface ("functional/test interface") to receive control signals based on the at-speed clock frequency requirements of the functional cores 540-11 to 540-23, respectively. As an example, the test portion of the functional/test interface may be compliant with any of the Joint Test Action Group (JTAG) standards. The PLLs 510-1 and 510-2 are configured to generate at-speed base clocks $CLK_{B1}$ and $CLK_{B2}$, respectively. In generating the at-speed base clocks, the PLLs 510-1 and 510-2 may generate feedback clocks phase/frequency locked to the reference clock CXO, and frequency divide the at-speed base clocks $CLK_{B1}$ and $CLK_{B2}$ to generate the feedback clocks based on control signals (e.g., specifying divider ratios) received via the functional/test interface. Thus, the at-speed base clocks $CLK_{B1}$ and $CLK_{B2}$ cycles with frequencies being the feedback divider ratios multiplied by the frequency of the reference clock CXO. The PLLs 510-1 and 510-2 include clock outputs, at which the at-speed base clocks $CLK_{B1}$ and $CLK_{B2}$, coupled to both clock inputs of the RCGs 520-1 and 520-2, respectively.

The set of RCGs 520-1 and 520-2 are configured to select one of its input at-speed base clocks $CLK_{B1}$ and $CLK_{B2}$ for outputting based on control signals received via the functional/test interface. Optionally, the set of RCGs 520-1 and 520-2 may include clock frequency dividers with programmable divider ratios based on control signals received via the functional/test interface. Accordingly, the RCGs 520-1 and 520-2 are configured to generate at-speed clocks $CLK_{AS1}$ and $CLK_{AS3}$ cycling at frequencies based on the frequencies of the selected at-speed base clocks $CLK_{B1}$ and $CLK_{B2}$ and optionally frequency divided by the programmed divider ratios. The RCGs 520-1 and 520-2 include clock outputs, at which the at-speed clocks $CLK_{AS1}$ and $CLK_{AS3}$ are generated, coupled to second clock inputs of TCCs 530-11 and 530-13, respectively. In this example, similar to IC 300, the output of the RCG 520-1 is further coupled to a clock input of the clock frequency divider 525.

The clock frequency divider 525 is configured to receive and frequency divide the at-speed clock $CLK_{AS1}$ from the RCG 520-1 based on control signals received from the functional/test interface to generate another at-speed clock $CLK_{AS2}$. Thus, in this configuration, an additional at-speed clock $CLK_{AS2}$ may be generated without requiring an additional RCG. The clock frequency divider 525 includes a clock output, at which the at-speed clock $CLK_{AS2}$ is generated, coupled to a second clock input of the first hierarchical-level TCC 530-12. The set of first hierarchical-level TCCs 530-11, 530-12, and 530-13 are configured to select the input clocks $CLK_1$/TCK, $CLK_{AS2}$/TCK, and $CLK_{AS3}$/TCK to generate output clocks $CLK_{O11}$, $CLK_{O12}$, and $CLK_{O13}$ based on control signals received from the functional/test interface, respectively. The TCCs 530-11, 530-12, and 530-13 include clock outputs, at which the output clocks $CLK_{O11}$, $CLK_{O12}$, and $CLK_{O13}$ are generated, coupled to clock inputs of the set of first hierarchical-level functional cores 540-11, 540-12, and 540-13, respectively. Each of the functional cores 540-11 to 540-13 may be implemented per any of the functional cores 340-1 to 340-3 previously discussed in detail.

In test shift mode as specified by control signals received via the functional/test interface, the set of first hierarchical-level functional cores 540-11, 540-12, and 540-13 are configured to shift-in input test vectors $S_{IN11}$, $S_{IN12}$, and $S_{IN13}$, and shift-out resulting output test vectors $S_{OUT11}$, $S_{OUT12}$, and $S_{OUT13}$, both under sequential control of the output clocks $CLK_{O11}$, $CLK_{O12}$, and $CLK_{O13}$, which may be based on the shift test clock TCK, respectively. In test capture mode as specified by control signals received via the functional/test interface, the set of first hierarchical-level functional cores 540-11, 540-12, and 540-13 are configured to perform capture test on the internal functional circuits to generate the output test vectors $S_{OUT11}$, $S_{OUT12}$, and $S_{OUT13}$ based on the input test vectors $S_{IN11}$, $S_{IN12}$, and $S_{IN13}$, under the sequential control of the output clocks $CLK_{O11}$, $CLK_{O12}$, and $CLK_{O13}$, which may be based on the at-speed clocks $CLK_{AS1}$, $CLK_{AS2}$, and $CLK_{AS3}$, respectively.

The clock outputs of the TCCs 530-11, 530-12, and 530-13 are also coupled to second clock inputs of the set of second hierarchical-level TCCs 530-21, 530-22, and 530-23, respectively. Similarly, the set of second hierarchical-level TCCs 530-21, 530-22, and 530-23 are configured to select the input clocks $CLK_{O11}$/TCK, $CLK_{O12}$/TCK, and $CLK_{O13}$/TCK to generate output clocks $CLK_{O21}$, $CLK_{O22}$, and $CLK_{O23}$ based on control signals received from the functional/test interface, respectively. The TCCs 530-21, 530-22, and 530-23 include clock outputs, at which the output clocks $CLK_{O21}$, $CLK_{O22}$, and $CLK_{O23}$ are generated, coupled to clock inputs of the set of second hierarchical-level functional cores 540-21, 540-22, and 540-23, respectively. Similarly, each of the functional cores 540-21 to 540-23 may be implemented per any of the functional cores 340-1 to 340-3 previously discussed in detail.

Also similarly, in test shift mode as specified by control signals received via the functional/test interface, the set of second hierarchical-level functional cores 540-21, 540-22, and 540-23 are configured to shift-in input test vectors $S_{IN21}$, $S_{IN22}$, and $S_{IN23}$, and shift-out resulting output test vectors $S_{OUT21}$, $S_{OUT22}$, and $S_{OUT23}$, both under sequential control of the output clocks $CLK_{O21}$, $CLK_{O22}$, and $CLK_{O23}$, which may be based on the shift test clock TCK, respectively. In test capture mode as specified by control signals received via the functional/test interface, the set of second hierarchical-level functional cores 540-21, 540-22, and 540-23 are configured to perform capture test on the internal functional circuits to generate the output test vectors $S_{OUT21}$, $S_{OUT22}$, and $S_{OUT23}$ based on the input test vectors $S_{IN21}$, $S_{IN22}$, and $S_{IN23}$, under the sequential control of the output clocks $CLK_{O21}$, $CLK_{O22}$, and $CLK_{O23}$, which may be based on the at-speed clocks $CLK_{AS1}$, $CLK_{AS2}$, and $CLK_{AS3}$, respectively.

In functional mode as specified by control signals received via the functional/test interface, the sets of first and second hierarchical-level functional cores 540-11, 540-12, and 540-13, 540-21, 540-22, and 540-23 employ their respective scan chains and functional circuits to process input functional data $D_{11}$, $D_{12}$, $D_{13}$, $D_{21}$, $D_{22}$, and $D_{23}$ to generate output functional data $Q_{11}$, $Q_{12}$, $Q_{13}$, $Q_{21}$, $Q_{22}$, and $Q_{23}$, respectively.

Figure 6:
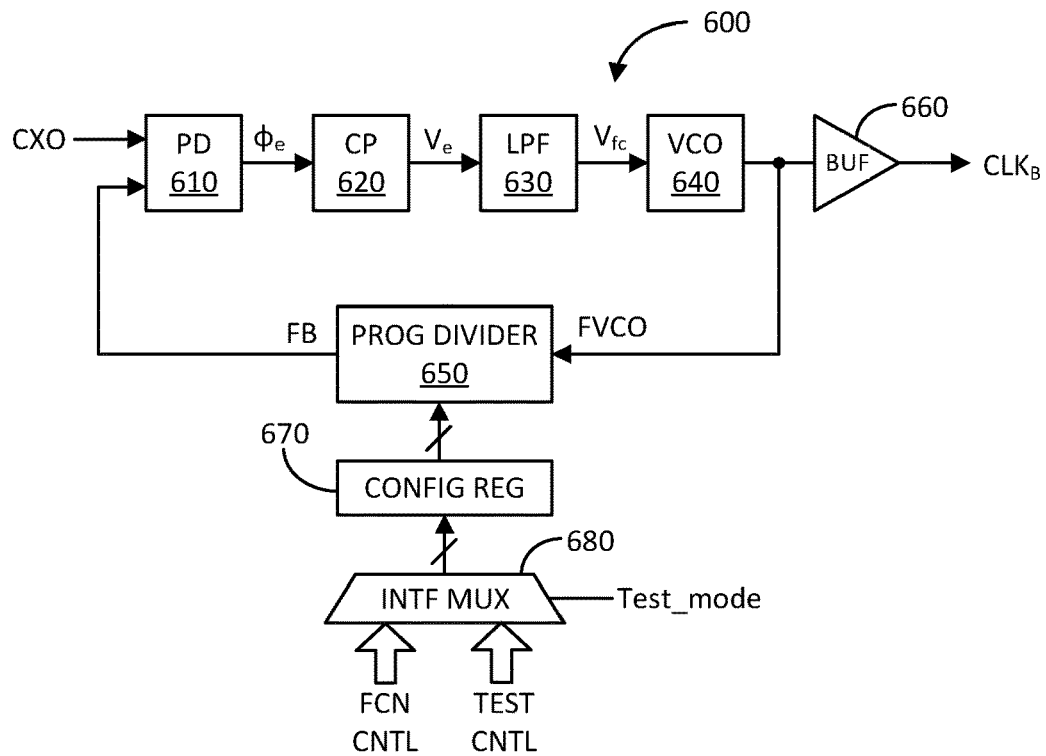
FIG. 6 illustrates a block diagram of an example phase lock loop (PLL) in accordance with another aspect of the disclosure.

FIG. 6 illustrates a block diagram of an example phase locked loop (PLL) 600 in accordance with another aspect of the disclosure. The PLL 600 may be an example implementation of any of the PLLs 310-1, 310-2, 510-1, and 510-2 previously described. In particular, the PLL 600 includes a phase detector (PD) 610, charge pump (CP) 620, low pass filter (LPF) 630, voltage controlled oscillator (VCO) 640, buffer 660, and a programmable divider 650. The PLL 600 may further include a functional/test interface multiplexer 680 and a configuration register 670.

The phase detector (PD) 610 includes a first input configured to receive the reference clock CXO, a second input to receive a feedback clock FB, and an output to generate a phase error signal $\phi_e$. The charge pump (CP) 620 is configured to generate a phase error voltage $V_e$ based on the phase error signal $\phi_e$ from the phase detector (PD) 610. The low pass filter (LPF) 630 is configured to integrate or filter the phase error voltage $V_e$ from the charge pump (CP) 620 to generate a frequency control voltage $V_{fe}$. The voltage controlled oscillator (VCO) 640 is configured to generate a clock FVCO based on the frequency control voltage $V_{fe}$. The buffer 660 is configured to generate an at-speed base clock $CLK_B$ based on the clock FVCO generated by the voltage controlled oscillator (VCO) 640. The programmable divider 650 (e.g., a multi-modulus divider) is configured to frequency divide the clock FVCO from the voltage controlled oscillator (VCO) 640 by a divider ratio to generate the feedback clock FB. In this configuration, the at-speed base clock $CLK_B$ cycles with a frequency substantially equal to the frequency of the reference clock CXO multiplied by the programmed divider ratio.

The functional/test interface multiplexer 680 includes two inputs to receive functional and test control signals, respectively. The functional/test interface multiplexer 680 further includes a select input to receive a test mode signal (it could also be referred to as a functional mode signal). The functional/test interface multiplexer 680 includes an output coupled to an input of the configuration register 670. The configuration register 670, in turn, includes an output coupled to an input of the programmable divider 650.

In operation, if the test mode signal is asserted (or the functional mode signal is deasserted), the functional/test interface multiplexer 680 outputs the test mode control signals, which are then stored in the configuration register 670. In this example, the test mode control signals specify the divider ratio for the programmable divider 650. The programmable divider 650 receives the specified divider ratio, and performs the frequency division of the clock FVCO based on the specified divider ratio. Similarly, if the test mode signal is deasserted (or the functional mode signal is asserted), the functional/test interface multiplexer 680 outputs the functional mode control signals, which are then stored in the configuration register 670. Similarly, the functional mode control signals specify the divider ratio for the programmable divider 650. The programmable divider 650 receives the specified divider ratio, and performs the frequency division of the clock FVCO based on the specified divider ratio.

Figure 7:
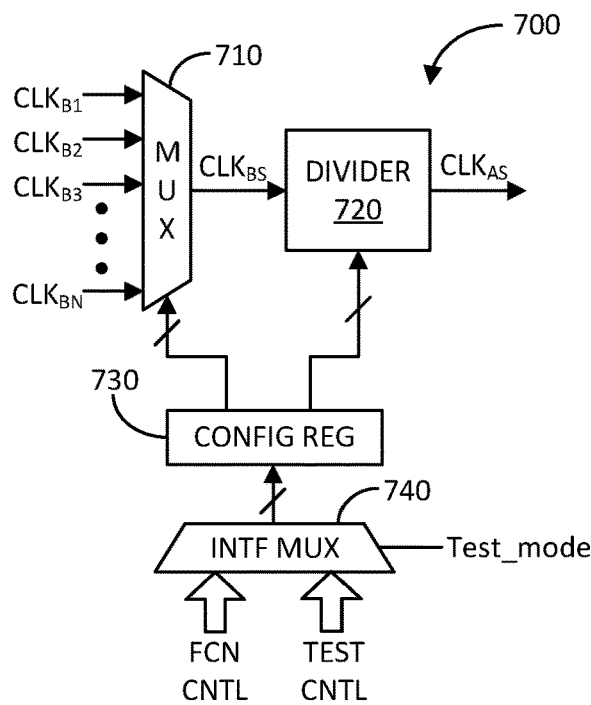
FIG. 7 illustrates a block diagram of an example root clock generator (RCG) in accordance with another aspect of the disclosure.

FIG. 7 illustrates a block diagram of an example root clock generator (RCG) 700 in accordance with another aspect of the disclosure. The RCG 700 may be an example implementation of any of the RCGs 320-1, 320-2, 520-1, and 520-2 previously described. In particular, the RCG 700 includes a clock selection multiplexer 710, an optional clock frequency divider 720, a functional/test interface multiplexer 740, and a configuration register 730.

The clock selection multiplexer 710 includes an N set of inputs configured to receive at-speed base clocks $CLK_{B1}$ to $CLK_{BN}$, which may be generated by one or more PLLs, such as PLLs 310-1, 310-2, 510-1, and 510-2 previously described. The letter N may be a positive integer of two (2) or more. The clock selection multiplexer 710 includes a select input coupled to the configuration register 730. The clock selection multiplexer 710 further includes an output coupled to an input of the optional clock divider 720, or may serve as the clock output of the RCG 700 if there is no clock frequency divider. Based on a control signal received from the configuration register 730, the clock selection multiplexer 710 outputs a selected base clock $CLK_{BS}$ (which serves as an output clock $CLK_{AS}$ if no clock frequency divider is present). The clock frequency divider 720 includes a control input coupled to the configuration register 730. Based on a control signal received from the configuration register 730, the clock selection multiplexer 710 frequency divides the selected base clock $CLK_{BS}$ by a divider ratio specified in the configuration register 730 to generate the output clock $CLK_{AS}$.

The functional/test interface multiplexer 740 includes two inputs to receive functional and test control signals, respectively. The functional/test interface multiplexer 740 further includes a select input to receive a test mode signal (it could also be referred to as a functional mode signal). The functional/test interface multiplexer 740 includes an output coupled to the configuration register 730. As mentioned, the configuration register 730, in turn, is coupled to the select and control inputs of the clock selection multiplexer 710 and the optional clock frequency divider 720, respectively.

In operation, if the test mode signal is asserted (or the functional mode signal is deasserted), the functional/test interface multiplexer 740 outputs the test mode control signals, which are then stored in the configuration register 730. In this example, the test mode control signals specify the base clock selection for the clock selection multiplexer 710 and the divider ratio for the clock frequency divider 720. The clock selection multiplexer 710 receives the specified selected base clock and the programmable divider 720 receives the specified divider ratio, and perform the clock selection and frequency division based on these control signals. Similarly, if the test mode signal is deasserted (or the functional mode signal is asserted), the functional/test interface multiplexer 740 outputs the functional mode control signals, which are then stored in the configuration register 730. In this example, the functional mode control signals specify the base clock selection for the clock selection multiplexer 710 and the divider ratio for the clock frequency divider 720. The clock selection multiplexer 710 receives the specified selected base clock and the programmable divider 720 receives the specified divider ratio, and perform the clock selection and frequency division based on these control signals.

Figure 8:
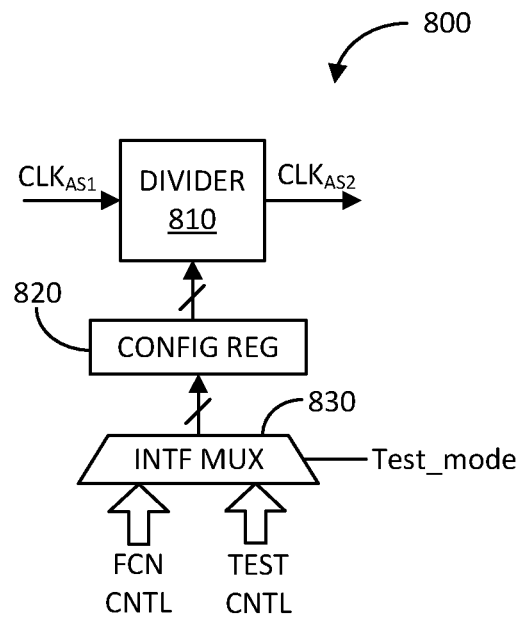
FIG. 8 illustrates a block diagram of an example clock frequency divider in accordance with another aspect of the disclosure.

FIG. 8 illustrates a block diagram of an example clock frequency divider 800 in accordance with another aspect of the disclosure. The clock frequency divider 800 may be an example implementation of any of the clock frequency dividers 325 and 525 previously described. In particular, the clock frequency divider 800 includes a frequency divider 810, a functional/test interface multiplexer 830, and a configuration register 820.

The frequency divider 810 includes an input to receive an at-speed clock $CLK_{AS1}$ from, for example, an RCG, such as RCGs 320-1 and 520-1 in ICs 300 and 500, respectively. The frequency divider 810 includes a control input coupled to the configuration register 820. Based on a control signal received from the configuration register 820, the frequency divider 810 frequency divides the at-speed clock $CLK_{AS1}$ by a divider ratio specified in the configuration register 820 to generate another at-speed clock $CLK_{AS2}$.

The functional/test interface multiplexer 830 includes two inputs to receive functional and test control signals, respectively. The functional/test interface multiplexer 830 further includes a select input to receive a test mode signal (it could also be referred to as a functional mode signal). The functional/test interface multiplexer 830 includes an output coupled to the configuration register 820. As mentioned, the configuration register 820, in turn, is coupled to the control input of the frequency divider 810.

In operation, if the test mode signal is asserted (or the functional mode signal is deasserted), the functional/test interface multiplexer 830 outputs the test mode control signals, which are then stored in the configuration register 820. In this example, the test mode control signals specify the divider ratio for the clock frequency divider 810. The frequency divider 810 receives the specified divider ratio, and performs the frequency division of the input at-speed clock $CLK_{AS1}$ based on the specified ratio to generate the output at-speed clock $CLK_{AS2}$. Similarly, if the test mode signal is deasserted (or the functional mode signal is asserted), the functional/test interface multiplexer 830 outputs the functional mode control signals, which are then stored in the configuration register 820. In this example, the functional mode control signals specify the divider ratio for the clock frequency divider 810. The frequency divider 810 receives the specified divider ratio, and performs the frequency division of the input at-speed clock $CLK_{AS1}$ based on the specified ratio to generate the output at-speed clock $CLK_{AS2}$.

Figure 9:
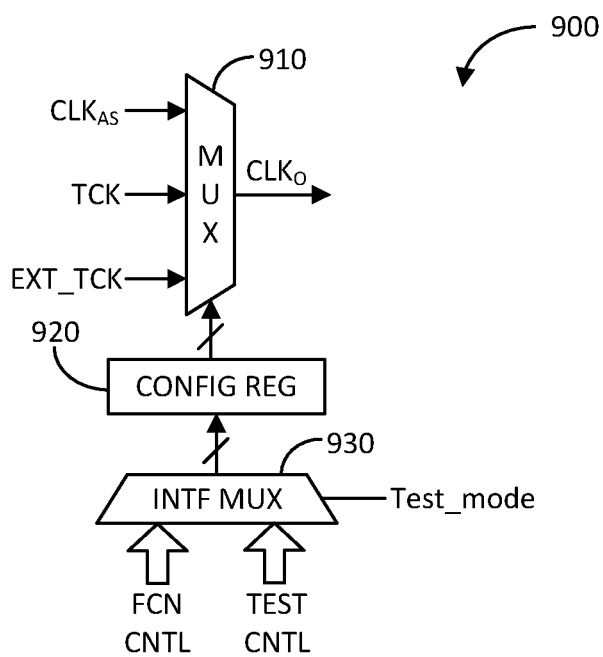
FIG. 9 illustrates a block diagram of an example test clock controller (TCC) in accordance with another aspect of the disclosure.

FIG. 9 illustrates a block diagram of an example test clock controller (TCC) 900 in accordance with another aspect of the disclosure. The TCC 900 may be an example implementation of any of the TCCs 330-1 to 330-3, first hierarchical-level TCCs 530-11 to 530-13, and second hierarchical-level TCCs 530-21 to 530-23 previously described. In particular, the TCC 900 includes a clock selection multiplexer 910, a functional/test interface multiplexer 930, and a configuration register 920.

The clock selection multiplexer 910 includes a first clock input configured to receive an at-speed clock $CLK_{AS}$, which may be generated by an RCG or clock frequency divider previously described. The clock selection multiplexer 910 includes a second clock input configured to receive a shift test clock TCK, which may be generated by shift clock source 304 or 504 previously described. Optionally, the clock selection multiplexer 910 may include a third clock input configured to receive an external shift clock EXT_TCK, for example, from a diagnostic test equipment external to an integrated circuit (IC) incorporating the TCC 900. The clock selection multiplexer 910 includes a select input coupled to the configuration register 920 to receive a control signal for selecting which of the input clocks $CLK_{AS}$, TCK, or EXT_TCK to output as the output clock $CLK_O$.

The functional/test interface multiplexer 930 includes two inputs to receive functional and test control signals, respectively. The functional/test interface multiplexer 930 further includes a select input to receive a test mode signal (it could also be referred to as a functional mode signal). The functional/test interface multiplexer 930 includes an output coupled to the configuration register 920. As mentioned, the configuration register 920, in turn, is coupled to the select input of the clock selection multiplexer 910.

In operation, if the test mode signal is asserted (or the functional mode signal is deasserted), the functional/test interface multiplexer 930 outputs the test mode control signals, which are then stored in the configuration register 920. In this example, the test mode control signals specify the clock selection for the clock selection multiplexer 910. The clock selection multiplexer 910 outputs the specified selected clock as the output clock $CLK_O$. Similarly, if the test mode signal is deasserted (or the functional mode signal is asserted), the functional/test interface multiplexer 930 outputs the functional mode control signals, which are then stored in the configuration register 920. In this example, the functional mode control signals specify the clock selection for the clock selection multiplexer 910. The clock selection multiplexer 910 outputs the specified selected clock as the output clock $CLK_O$.

Figure 10:
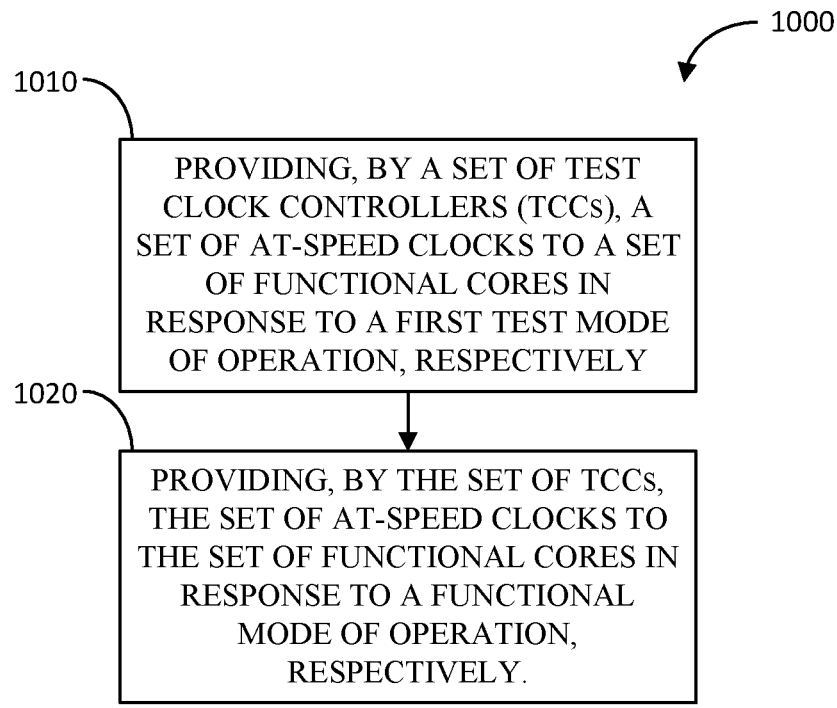
FIG. 10 illustrates a flow diagram of an example method of providing functional and test clocks to a set of functional cores of an integrated circuit (IC) in accordance with another aspect of the disclosure.

FIG. 10 illustrates a flow diagram of an example method 1000 of providing functional and test clocks to a set of functional cores of an integrated circuit (IC) in accordance with another aspect of the disclosure. The method 1000 includes providing, by a set of test clock controllers (TCCs), a set of at-speed clocks to a set of functional cores in response to a first test mode of operation, respectively (block 1010). Examples of means for providing a set of at-speed clocks to a set of functional cores in response to a first test mode of operation, respectively, include the set of TCCs 330-1 to 330-3 in IC 300 configured in capture test mode, and the first and second hierarchical-level TCCs 530-11 to 530-13 and 530-21 and 530-23 configured in capture test mode, respectively.

Additionally, the method 1000 includes providing, by the set of TCCs, the set of at-speed clocks to the set of functional cores in response to a functional mode of operation, respectively (block 1020). Examples of means for providing the set of at-speed clocks to the set of functional cores in response to a functional mode of operation, respectively, include the set of TCCs 330-1 to 330-3 in IC 300 configured in functional mode, and the first and second hierarchical-level TCCs 530-11 to 530-13 and 530-21 and 530-23 configured in functional mode, respectively.

The method 1000 may further include providing a shift test clock to the set of functional cores in response to a second test mode of operation. Examples of means for providing a shift test clock to the set of functional cores in response to a second test mode of operation, respectively, include the set of TCCs 330-1 to 330-3 in IC 300 configured in shift test mode, and the first and second hierarchical-level TCCs 530-11 to 530-13 and 530-21 and 530-23 configured in shift test mode.

Figure 11:
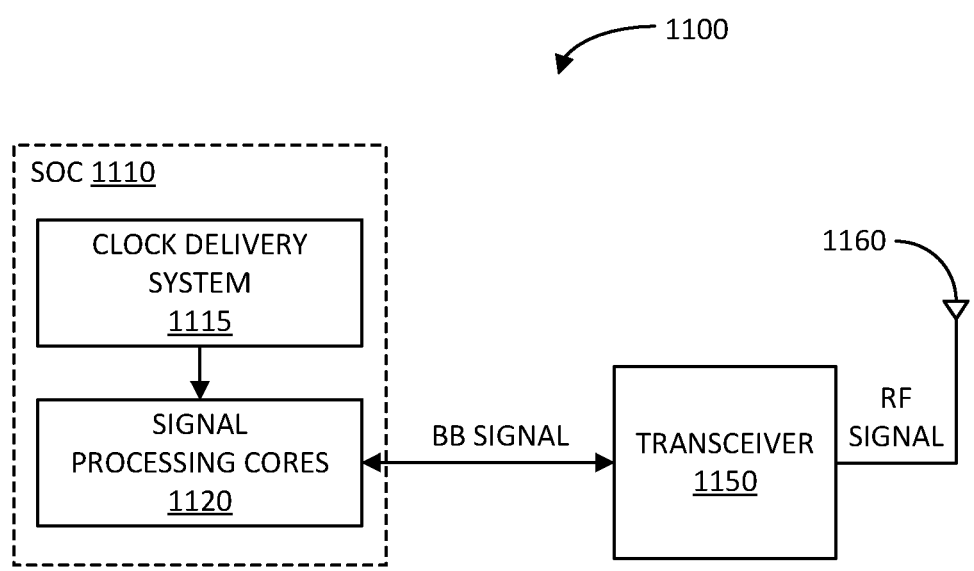
FIG. 11 illustrates a block diagram of an example wireless communication device in accordance with another aspect of the disclosure.

FIG. 11 illustrates a block diagram of an example wireless communication device 1100 in accordance with another aspect of the disclosure. The wireless communication device 1100 may be any type of wireless communication device, including a smart phone, WiFi device, wide area network (WAN) device, Internet of Things (IoT) device, and others.

In particular, the wireless communication device 1100 includes an integrated circuit (IC) 1110, which may be configured as a system on chip (SOC). The SOC 1110 includes a clock delivery system 1115 and a set of signal processing cores 1120. The clock delivery system 1115 may be implemented per the clock delivery architecture of ICs 300 and 500, including one or more PLLs each having a functional/test interface, one or more RCGs each having a functional/test interface, one or more clock frequency dividers each having a functional/test interface, and a set of TCCs each having a functional/test interface.

The set of signal processing cores 1120 may be configured to generate a transmit baseband (BB) signal for transmission to one or more remote wireless communication devices, and process a receive baseband (BB) signal received from one or more wireless communication devices. For functional and design for testability (DFT) operations, the clock delivery system 1115 include a set of clock outputs coupled a set of clock inputs of the set of signal processing cores 1120, respectively. More specifically, the set of TCCs of the clock delivery system 1115 may provide at-speed clocks (for functional and capture test operations) and a shift test clock (for shifting in and out test vectors and/or performing low clock speed test operations) to the set of one or more signal processing cores 1120, respectively.

The set of signal processing cores 1120 is coupled to a transceiver 1150 to provide thereto the transmit BB signal and receive therefrom the received BB signal. The transceiver 1150, in turn, is configured to generate a transmit radio frequency (RF) signal based on the transmit BB signal, and generate the received BB signal based on a received RF signal. The transceiver 1150 is coupled to an at least one antenna 1160 (e.g., an antenna array) to provide thereto the transmit RF signal, and receive therefrom the received RF signal. The at least one antenna 1160 is configured to radiate the transmit RF signal for wireless transmission to one or more wireless communication devices, and to pick up the radiated received RF signal transmitted by one or more wireless communication devices.

The following provides an overview of aspects of the present disclosure:

Aspect 1: An integrated circuit (IC), including: a first set of test clock controllers (TCCs) including a first set of clock outputs, respectively; and a first set of functional cores including a first set of clock inputs coupled to the first set of clock outputs of the first set of TCCs, respectively.

Aspect 2: The IC of aspect 1, wherein the first set of TCCs includes: a first set of clock inputs configured to receive a set of at-speed clocks, respectively; a second set of clock inputs configured to receive a first shift test clock; and a first set of functional/test interfaces, respectively.

Aspect 3: The IC of aspect 2, wherein the first set of TCCs are configured to select the set of at-speed clocks or the first shift test clock to generate a set of output clocks at the first set of clock outputs based on control signals received via the first set of functional/test interfaces, respectively.

Aspect 4: The IC of aspect 3, wherein the first set of TCCs are configured to select the set of at-speed clocks to generate the set of output clocks in response to the control signals indicating a functional mode of operation, respectively.

Aspect 5: The IC of aspect 3 or 4, wherein the first set of TCCs are configured to select the set of at-speed clocks to generate the set of output clocks in response to the control signals indicating a capture test mode of operation, respectively.

Aspect 6: The IC of any one of aspects 3-5, wherein the first set of TCCs are configured to select the first shift test clock to generate the set of output clocks in response to the control signals indicating a shift test mode of operation, respectively.

Aspect 7: The IC of any one of aspects 2-6, wherein the first set of TCCs further includes a third set of clock inputs configured to receive a second shift test clock.

Aspect 8: The IC of any one of aspects 2-7, further including a set of clock generators, including: a set of multiplexers, including: a third set of clock inputs configured to receive a first at-speed base clock, respectively; a fourth set of clock inputs configured to receive a second at-speed base clock, respectively; a set of select inputs, respectively; and a second set of clock outputs, respectively; and a set of clock frequency dividers, including: a fifth set of clock inputs coupled to the second set of clock outputs of the set of multiplexers, respectively; and a third set of clock outputs coupled to the first set of clock inputs of the first set of TCCs, respectively; and a second set of functional/test interfaces coupled to the set of select inputs of the set of multiplexers, respectively.

Aspect 9: The IC of aspect 8, wherein the set of clock generators are configured to select the first at-speed base clock to generate the set of at-speed clocks in response to a first set of control signals received via the second set of functional/test interfaces indicating a first mode of operation, respectively.

Aspect 10: The IC of aspect 9, wherein the set of clock generators are configured to select the second at-speed base clock to generate the set of at-speed clocks in response to a second set of control signals received via the second set of functional/test interfaces indicating a second mode of operation, respectively.

Aspect 11: The IC of aspect 8, wherein: a first subset of one or more of the set of clock generators are configured to select the first at-speed base clock to generate a first subset of the set of at-speed clocks in response to a first set of control signals received via a first subset of the second set of functional/test interfaces, respectively; and a second subset of one or more of the set of clock generators are configured to select the second at-speed base clock to generate a second subset of the set of at-speed clocks in response to a second set of control signals received via a second subset of the second set of functional/test interfaces, respectively.

Aspect 12: The IC of any one of aspects 8-11, wherein the set of clock generators are configured to frequency divide the first at-speed base clock or the second at-speed base clock to generate the set of at-speed clocks in response to control signals received via the second set of functional/test interfaces, respectively.

Aspect 13: The IC of any one of aspects 8-12, further including at least one clock frequency divider including: at least one clock input coupled to at least one of the second set of clock outputs of at least one of the set of clock generators, respectively; at least one clock output coupled to at least one of the first set of clock inputs of the first set of TCCs; and at least one functional/test interface.

Aspect 14: The IC of aspect 13, wherein the at least one clock frequency divider is configured to frequency divide at least one of the set of at-speed clocks to generate at least another of the set of at-speed clocks based on control signals indicating at least one divider ratio received via the at least one functional/test interface, respectively.

Aspect 15: The IC of any one of aspects 8-14, further including: a first phase locked loop (PLL) including: a first clock input configured to receive a reference clock; a first functional/test interface; and a first clock output configured to generate the first at-speed base clock based on a first control signal received via the first functional/test interface; and a second PLL including: a second clock input configured to receive the reference clock; a second functional/test interface; and a second clock output configured to generate the second at-speed base clock based on a second control signal received via the second functional/test interface.

Aspect 16: The IC of aspect 15, wherein the first control signal specifies a first divider ratio for a first programmable divider situated in a first feedback path of the first PLL, and wherein the second control signal specifies a second divider ratio for a second programmable divider situated in a second feedback path of the second PLL.

Aspect 17: The IC of any one of aspects 1-16, further including: a second set of test clock controllers (TCCs) including: a second set of clock inputs coupled to the first set of clock outputs of the first set of TCCs, respectively; a second set of clock outputs; and a second set of functional cores including a second set of clock inputs coupled to the second set of clock outputs of the second set of TCCs, respectively.

Aspect 18: The IC of aspect 17, wherein: the first set of TCCs includes: a third set of clock inputs configured to receive a set of at-speed clocks, respectively; a fourth set of clock inputs configured to receive a shift test clock, respectively; and a first set of functional/test interfaces, respectively; and the second set of TCCs further includes: a fifth set of clock inputs configured to Aspect 19: The IC of any one of aspects 1-19, wherein the first set of functional cores includes: a set of scan chains, respectively; a set of functional circuits coupled to the set of scan chains, respectively; and a set of functional/test interfaces, respectively.

Aspect 20: The IC of aspect 19, wherein the set of scan chains is configured to shift-in and shift-out test vectors under sequential control of a first set of clocks received from the first set of clock outputs of the first set of TCCs in response to control signals indicating a shift test mode of operation received via the set of functional/test interfaces, respectively.

Aspect 21: The IC of aspect 19 or 20, wherein the set of scan chains is configured to provide and receive functional or test data from the set of functional circuits under sequential control of a second set of clocks received from the first set of clock outputs of the first set of TCCs in response to control signals indicating a functional or capture test mode of operation received via the set of functional/test interfaces, respectively.

Aspect 22: A method, including: providing, by a set of test clock controllers (TCCs), a set of at-speed clocks to a set of functional cores in response to a first test mode of operation, respectively; and providing, by the set of TCCs, the set of at-speed clocks to the set of functional cores in response to a functional mode of operation, respectively.

Aspect 23: The method of aspect 22, wherein the first test mode of operation includes a capture test mode of operation.

Aspect 24: The method of aspect 22 or 23, further including providing a shift test clock to the set of functional cores in response to a second test mode of operation.

Aspect 25: The method of aspect 24, wherein the second test mode of operation includes a shift test mode of operation.

Aspect 26: An apparatus, including: means for providing a set of at-speed clocks to a set of functional cores in response to a first test mode of operation, respectively; and means for providing the set of at-speed clocks to the set of functional cores in response to a functional mode of operation, respectively.

Aspect 27: The apparatus of aspect 26, wherein the first test mode of operation includes a capture test mode of operation.

Aspect 28: The apparatus of aspect 26 or 27, further including means for providing a shift test clock to the set of functional cores in response to a second test mode of operation.

Aspect 29: The apparatus of claim 28, wherein the second test mode of operation includes a shift test mode of operation.

Aspect 30: A wireless communication device includes at least one antenna; a transceiver coupled to the at least one antenna; a set of digital signal processing cores coupled to the transceiver; and a clock delivery system, including a first set of test clock controllers (TCCs) including a set of clock outputs coupled to a set of clock inputs of the set of digital signal processing cores, respectively.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An integrated circuit (IC), comprising:
    a first set of test clock controllers (TCCs) including a first set of clock outputs, respectively, wherein the first set of TCCs comprises:
        a first set of clock inputs configured to receive a set of at-speed clocks, respectively,
        a second set of clock inputs configured to receive a first shift test clock, and
        a first set of functional/test interfaces configured to receive control signals indicating a mode of operation, respectively; and
    a first set of functional cores including a first set of clock inputs coupled to the first set of clock outputs of the first set of TCCs, respectively.

2. The IC of claim 1, wherein the first set of TCCs are configured to select the set of at-speed clocks or the first shift test clock to generate a set of output clocks at the first set of clock outputs based on the control signals received via the first set of functional/test interfaces, respectively.

3. The IC of claim 2, wherein the first set of TCCs are configured to select the set of at-speed clocks to generate the set of output clocks in response to the control signals indicating a functional mode of operation, respectively.

4. The IC of claim 2, wherein the first set of TCCs are configured to select the set of at-speed clocks to generate the set of output clocks in response to the control signals indicating a capture test mode of operation, respectively.

5. The IC of claim 2, wherein the first set of TCCs are configured to select the first shift test clock to generate the set of output clocks in response to the control signals indicating a shift test mode of operation, respectively.

6. The IC of claim 1, wherein the first set of TCCs further comprises a third set of clock inputs configured to receive a second shift test clock.

7. The IC of claim 1, further comprising a set of clock generators, comprising:
    a set of multiplexers, comprising:
        a third set of clock inputs configured to receive a first at-speed base clock, respectively;
        a fourth set of clock inputs configured to receive a second at-speed base clock, respectively;
        a set of select inputs, respectively; and
        a second set of clock outputs, respectively;
    a set of clock frequency dividers comprising:
        a fifth set of clock inputs coupled to the second set of clock outputs of the set of multiplexers, respectively; and
        a third set of clock outputs coupled to the first set of clock inputs of the first set of TCCs, respectively; and
    a second set of functional/test interfaces coupled to the set of select inputs of the set of multiplexers, respectively.

8. The IC of claim 7, wherein the set of clock generators are configured to select the first at-speed base clock to generate the set of at-speed clocks in response to a first set of control signals received via the second set of functional/test interfaces indicating a first mode of operation, respectively.

9. The IC of claim 8, wherein the set of clock generators are configured to select the second at-speed base clock to generate the set of at-speed clocks in response to a second set of control signals received via the second set of functional/test interfaces indicating a second mode of operation, respectively.

10. The IC of claim 7, wherein:
a first subset of one or more of the set of clock generators are configured to select the first at-speed base clock to generate a first subset of the set of at-speed clocks in response to a first set of control signals received via a first subset of the second set of functional/test interfaces, respectively; and
a second subset of one or more of the set of clock generators are configured to select the second at-speed base clock to generate a second subset of the set of at-speed clocks in response to a second set of control signals received via a second subset of the second set of functional/test interfaces, respectively.

11. The IC of claim 7, wherein the set of clock generators are configured to frequency divide the first at-speed base clock or the second at-speed base clock to generate the set of at-speed clocks in response to control signals received via the second set of functional/test interfaces, respectively.

12. The IC of claim 7, further comprising at least one clock frequency divider comprising:
at least one clock input coupled to at least one of the second set of clock outputs of at least one of the set of clock generators, respectively;
at least one clock output coupled to at least one of the first set of clock inputs of the first set of TCCs; and
at least one functional/test interface.

13. The IC of claim 12, wherein the at least one clock frequency divider is configured to frequency divide at least one of the set of at-speed clocks to generate at least another of the set of at-speed clocks based on control signals indicating at least one divider ratio received via the at least one functional/test interface, respectively.

14. The IC of claim 7, further comprising:
a first phase locked loop (PLL) comprising:
a first clock input configured to receive a reference clock;
a first functional/test interface; and
a first clock output configured to generate the first at-speed base clock based on a first control signal received via the first functional/test interface; and
a second PLL comprising:
a second clock input configured to receive the reference clock;
a second functional/test interface; and
a second clock output configured to generate the second at-speed base clock based on a second control signal received via the second functional/test interface.

15. The IC of claim 14, wherein the first control signal specifies a first divider ratio for a first programmable divider situated in a first feedback path of the first PLL, and wherein the second control signal specifies a second divider ratio for a second programmable divider situated in a second feedback path of the second PLL.

16. The IC of claim 1, further comprising:
a second set of test clock controllers (TCCs) comprising:
a second set of clock inputs coupled to the first set of clock outputs of the first set of TCCs, respectively; and
a second set of clock outputs; and
a second set of functional cores including a second set of clock inputs coupled to the second set of clock outputs of the second set of TCCs, respectively.

17. The IC of claim 16, wherein:
the first set of TCCs comprises:
a third set of clock inputs configured to receive a set of at-speed clocks, respectively; and
a fourth set of clock inputs configured to receive a shift test clock, respectively; and
a first set of functional/test interfaces, respectively; and
the second set of TCCs further comprises:
a fifth set of clock inputs configured to receive the first shift test clock, respectively;
a second set of functional/test interfaces, respectively.

18. The IC of claim 1, wherein the first set of functional cores comprises:
a set of scan chains, respectively;
a set of functional circuits coupled to the set of scan chains, respectively; and
a set of functional/test interfaces, respectively.

19. The IC of claim 18, wherein the set of scan chains are configured to shift-in and shift-out test vectors under sequential control of a first set of clocks received from the first set of clock outputs of the first set of TCCs in response to control signals indicating a shift test mode of operation received via the set of functional/test interfaces, respectively.

20. The IC of claim 19, wherein the set of scan chains are configured to provide and receive functional or test data from the set of functional circuits under sequential control of a second set of clocks received from the first set of clock outputs of the first set of TCCs in response to control signals indicating a functional or capture test mode of operation received via the set of functional/test interfaces, respectively.

21. A method, comprising:
receiving, by a set of test clock controllers (TCCs) via a set of functional/test interfaces, control signals indicating a mode of operation, respectively;
providing, by the set of TCCs, a set of at-speed clocks to a set of functional cores in response to the mode of operation being a first test mode of operation, respectively; and
providing, by the set of TCCs, the set of at-speed clocks to the set of functional cores in response to the mode of operation being a functional mode of operation, respectively.

22. The method of claim 21, wherein the first test mode of operation comprises a capture test mode of operation.

23. The method of claim 21, further comprising providing a shift test clock to the set of functional cores in response to the mode of operation being a second test mode of operation.

24. The method of claim 23, wherein the second test mode of operation comprises a shift test mode of operation.

25. An apparatus, comprising:
means for receiving, via a set of functional/test interfaces, control signals indicating a mode of operation, respectively;
means for providing a set of at-speed clocks to a set of functional cores in response to the mode of operation being a first test mode of operation, respectively; and
means for providing the set of at-speed clocks to the set of functional cores in response to the mode of operation being a functional mode of operation, respectively.

26. The apparatus of claim 25, wherein the first test mode of operation comprises a capture test mode of operation.

27. The apparatus of claim 25, further comprising means for providing a shift test clock to the set of functional cores in response to the mode of operation being a second test mode of operation.

28. The apparatus of claim 27, wherein the second test mode of operation comprises a shift test mode of operation.

29. A wireless communication device, comprising:
- at least one antenna;
- a transceiver coupled to the at least one antenna;
- a set of digital signal processing cores coupled to the transceiver; and
- a clock delivery system, comprising a first set of test clock controllers (TCCs) including a set of clock outputs coupled to a set of clock inputs of the set of digital signal processing cores, respectively, wherein the first set of TCCs further includes:
  - a first set of clock inputs configured to receive a set of at-speed clocks, respectively,
  - a second set of clock inputs configured to receive a first shift test clock, and
  - a first set of functional/test interfaces configured to receive control signals indicating a mode of operation, respectively.

* * * * *